US012660665B2

(12) United States Patent
  Baek

(10) Patent No.:  US 12,660,665 B2
(45) Date of Patent:  Jun. 16, 2026

(54) SEMICONDUCTOR PACKAGE INCLUDING INTERPOSORS AND ELECTRONIC SYSTEM

(71) Applicant: Samsung Electronics Co., Ltd., Suwon-si (KR)

(72) Inventor: Kiwon Baek, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 366 days.

(21) Appl. No.: 18/346,950

(22) Filed: Jul. 5, 2023

(65) Prior Publication Data

US 2024/0014113 A1     Jan. 11, 2024

(30) Foreign Application Priority Data

Jul. 5, 2022   (KR) ........................ 10-2022-0082615

(51) Int. Cl.
  *H01L 23/498*      (2006.01)
  *H01L 23/00*      (2006.01)
    (Continued)

(52) U.S. Cl.
  CPC .... *H01L 23/49822* (2013.01); *H01L 23/5383* (2013.01); *H01L 24/08* (2013.01); *H01L 24/16* (2013.01); *H01L 24/32* (2013.01); *H01L 24/48* (2013.01); *H01L 24/73* (2013.01); *H01L 25/0652* (2013.01); *H01L 2224/08235* (2013.01); *H01L 2224/16148* (2013.01);
    (Continued)

(58) Field of Classification Search
  None
  See application file for complete search history.

(56) References Cited

U.S. PATENT DOCUMENTS 6,984,889 B2 *   1/2006  Kimura ............. H01L 23/49833
                                257/784
8,704,364 B2 *   4/2014  Banijamali ......... H01L 23/5385
                                257/E23.079
      (Continued)

FOREIGN PATENT DOCUMENTS

KR    10-2018-0079007 A    7/2018
KR    10-2021-0013429 A    2/2021
        (Continued)

*Primary Examiner* — Cory W Eskridge
(74) *Attorney, Agent, or Firm* — Wolf, Greenfield & Sacks, P.C.

(57)          ABSTRACT
An electronic system includes a first interposer including first signal paths, a second interposer spaced apart from the first interposer and including second signal paths, a first semiconductor chip structure on the first and second interposers and including a first circuit region and a second circuit region, and a second semiconductor chip structure on the first and second interposers and spaced apart from the first semiconductor chip structure. The second semiconductor chip structure includes a third circuit region configured to communicate with the first circuit region of the first semiconductor chip structure at a first rate through the first signal paths of the first interposer and a fourth circuit region configured to communicate with the second circuit region of the first semiconductor chip structure at a second rate, different from the first rate, through the second signal paths of the second interposer.

20 Claims, 21 Drawing Sheets

(51) Int. Cl.

| | | |
|---|---|---|
| *H01L 23/538* | (2006.01) | |
| *H01L 25/065* | (2023.01) | |

(52) U.S. Cl.
CPC ............... *H01L 2224/16227* (2013.01); *H01L 2224/16238* (2013.01); *H01L 2224/32145* (2013.01); *H01L 2224/32225* (2013.01); *H01L 2224/48145* (2013.01); *H01L 2224/48229* (2013.01); *H01L 2224/73265* (2013.01); *H01L 2924/1436* (2013.01); *H01L 2924/1438* (2013.01)

(56) References Cited

U.S. PATENT DOCUMENTS

| | | | |
|---|---|---|---|
| 8,704,384 | B2 | 4/2014 | Wu et al. |
| 9,165,906 | B2 | 10/2015 | Mohammed et al. |
| 9,651,751 | B1 | 5/2017 | Ding et al. |
| 2008/0296697 | A1 | 12/2008 | Hsu et al. |
| 2011/0180317 | A1 | 7/2011 | Takahashi et al. |

FOREIGN PATENT DOCUMENTS

| | | | |
|---|---|---|---|
| KR | 10-2022-0007410 | A | 1/2022 |
| KR | 10-2022-0075030 | A | 6/2022 |

* cited by examiner

SEMICONDUCTOR PACKAGE INCLUDING INTERPOSORS AND ELECTRONIC SYSTEM

CROSS-REFERENCE TO RELATED APPLICATION(S)

This application claims benefit of priority to Korean Patent Application No. 10-2022-0082615, filed on Jul. 5, 2022 in the Korean Intellectual Property Office, the disclosure of which is incorporated herein by reference in its entirety.

BACKGROUND

A semiconductor package may include a plurality of interposers and an electronic system including the same.

Recently, semiconductor packages using an interposer and including a plurality of semiconductor chips have been developed in accordance with demand for high performance and high integration of semiconductor packages.

SUMMARY

Example embodiments provide a semiconductor package having improved performance, while including a plurality of interposers and a plurality of semiconductor chip structures.

Example embodiments provide an electronic system including the semiconductor package.

According to example embodiments, an electronic system includes a first interposer including first signal paths, a second interposer spaced apart from the first interposer and including second signal paths, a first semiconductor chip structure on the first and second interposers and including a first circuit region and a second circuit region, and a second semiconductor chip structure on the first and second interposers and spaced apart from the first semiconductor chip structure. The second semiconductor chip structure includes a third circuit region configured to communicate with the first circuit region of the first semiconductor chip structure at a first rate through the first signal paths of the first interposer and a fourth circuit region configured to communicate with the second circuit region of the first semiconductor chip structure at a second rate, different from the first rate, through the second signal paths of the second interposer.

According to example embodiments, an electronic system includes a first interposer including first signal paths, a second interposer spaced apart from the first interposer and including second signal paths, a controller semiconductor chip on the first and second interposers, and a memory semiconductor chip on the first and second interposers and spaced apart from the controller semiconductor chip. The controller semiconductor chip is configured to communicate data with the memory semiconductor chip through the first signal paths of the first interposer, and the memory semiconductor chip is configured to receive a command and an address signal from the controller semiconductor chip through the second signal paths of the second interposer.

According to example embodiments, a semiconductor package includes a package substrate, a first interposer on the package substrate and including first signal paths, a second interposer on the package substrate, spaced apart from the first interposer, and including second signal paths, a first semiconductor chip structure on the first and second interposers, and at least one second semiconductor chip structure on the first and second interposers, electrically connected to the first semiconductor chip structure through the first signal paths, and electrically connected to the first semiconductor chip structure through the second signal paths. The number of the first signal paths is different from the number of the second signal paths.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
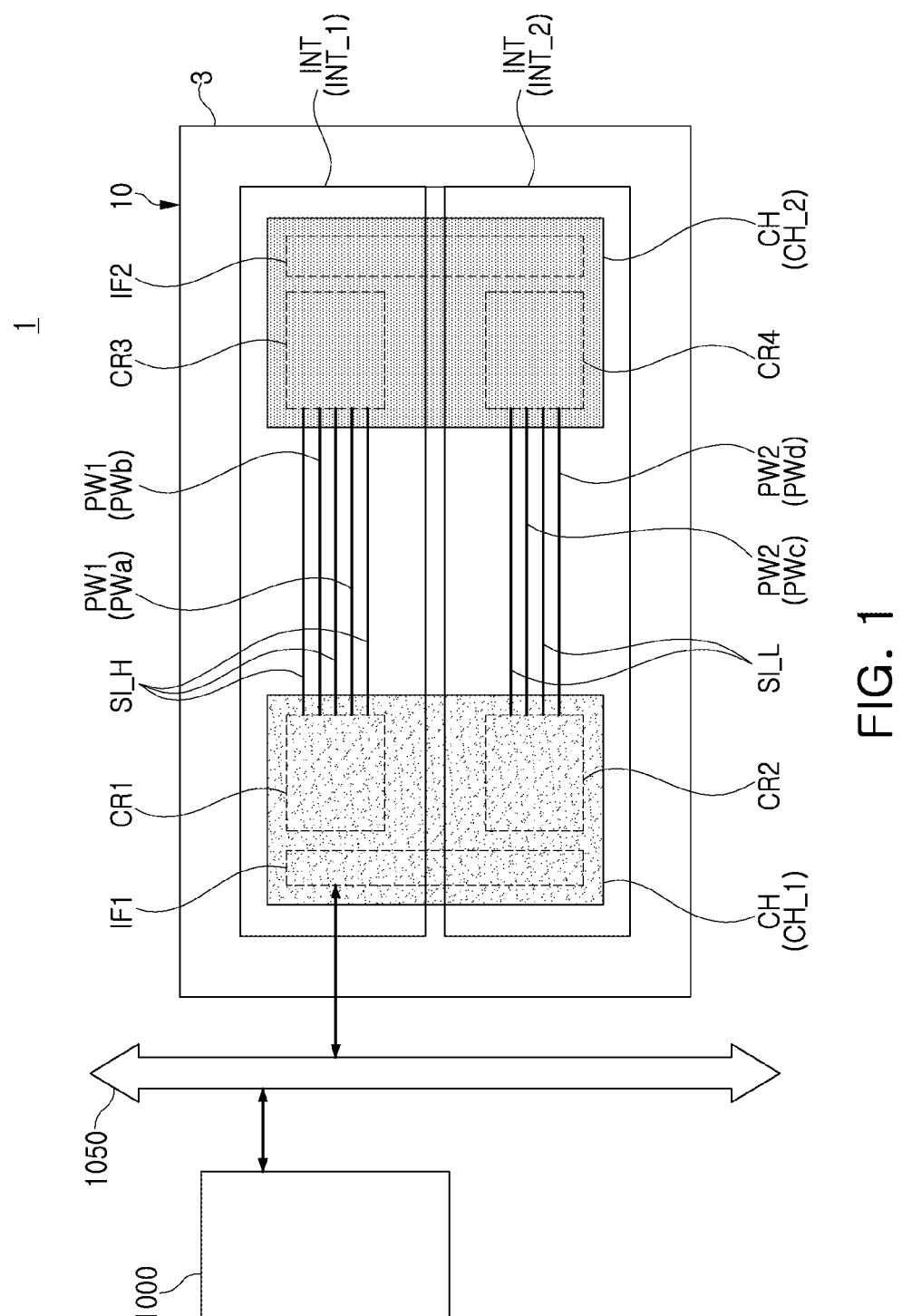
FIG. 1 is a diagram schematically illustrating an electronic system including a semiconductor package according to some embodiments of the present inventive concept.

The present inventive concept will be understood through the following examples in conjunction with the accompanying drawings. However, the present inventive concept is not limited to the embodiments described herein and may be embodied in other forms. In some embodiments, when it is mentioned that certain elements or lines are connected to a target region, it may include not only direct connection but also indirect connection via other elements. In addition, a connection relationship between regions and lines described with reference to the drawings in some embodiments is only shown for an effective description of the technical content, and some embodiments may further include other regions and other lines not shown in the drawings.

An electronic system according to some embodiments of the present inventive concept will be described with reference to FIG. 1. FIG. 1 is a diagram schematically illustrating an electronic system according to some embodiments of the present inventive concept.

Referring to FIG. 1, an electronic system 1 according to some embodiments may include a plurality of interposers INT and a plurality of semiconductor chip structures CH on the plurality of interposers INT.

The plurality of interposers INT may include a first interposer INT_1 and a second interposer INT_2 spaced apart from each other.

The first interposer INT_1 may include first signal paths SI_H.

The second interposer INT_2 may include second signal paths SI_L.

The first interposer INT_1 may further include first power/ground paths PW1 adjacent the first signal paths SI_H. The first power/ground paths PW may include first power paths PWa and first ground paths PWb.

The second interposer INT_2 may further include second power/ground paths PW2 adjacent the second signal paths SI_L. The second power/ground paths PW2 may include second power paths PWc and second ground paths PWd.

The number of the first signal paths SI_H may be greater than the number of the second signal paths SI_L. For example, the number of the first signal paths SI_H may be about 1.5 times to about 1.8 times greater than the number of the second signal paths SI_L.

The plurality of semiconductor chip structures CH may include a first semiconductor chip structure CH_1 and a second semiconductor chip structure CH_2 that are spaced apart from each other.

The first semiconductor chip structure CH_1 may be on the first and second interposers INT_1 and INT_2. The second semiconductor chip structure CH_2 may be on the first and second interposers INT_1 and INT_2.

The electronic system 1 may further include a package substrate 3. The plurality of interposers INT may be mounted on the package substrate 3. The plurality of semiconductor chip structures CH may be mounted on the plurality of interposers INT.

The first semiconductor chip structure CH_1 may include at least one first semiconductor chip. The second semiconductor chip structure CH_2 may include at least one second semiconductor chip.

The at least one first semiconductor chip of the first semiconductor chip structure CH_1 and the at least one second semiconductor chip of the second semiconductor chip structure CH_2 may include circuit regions capable of communicating at different rates. For example, the first semiconductor chip structure CH_1 may include a first circuit region CR1 and a second circuit region CR2, and the second semiconductor chip structure CH_2 may include a third circuit region CR3 configured to communicate with the first circuit region CR1 and a fourth circuit region CR4 configured communicate with the second circuit region CR2.

The third circuit region CR3 may be configured to communicate with the first circuit region CR1 at a first rate through the first signal paths SI_H of the first interposer INT_1. The fourth circuit region CR4 may be configured to communicate with the second circuit region CR2 at a second rate slower than the first rate through the second signal paths SI_L of the second interposer INT_2.

The first signal paths SI_H may be referred to as 'fast signal paths', and the second signal paths SI_L may be referred to as 'slow signal paths'.

Figure 2:
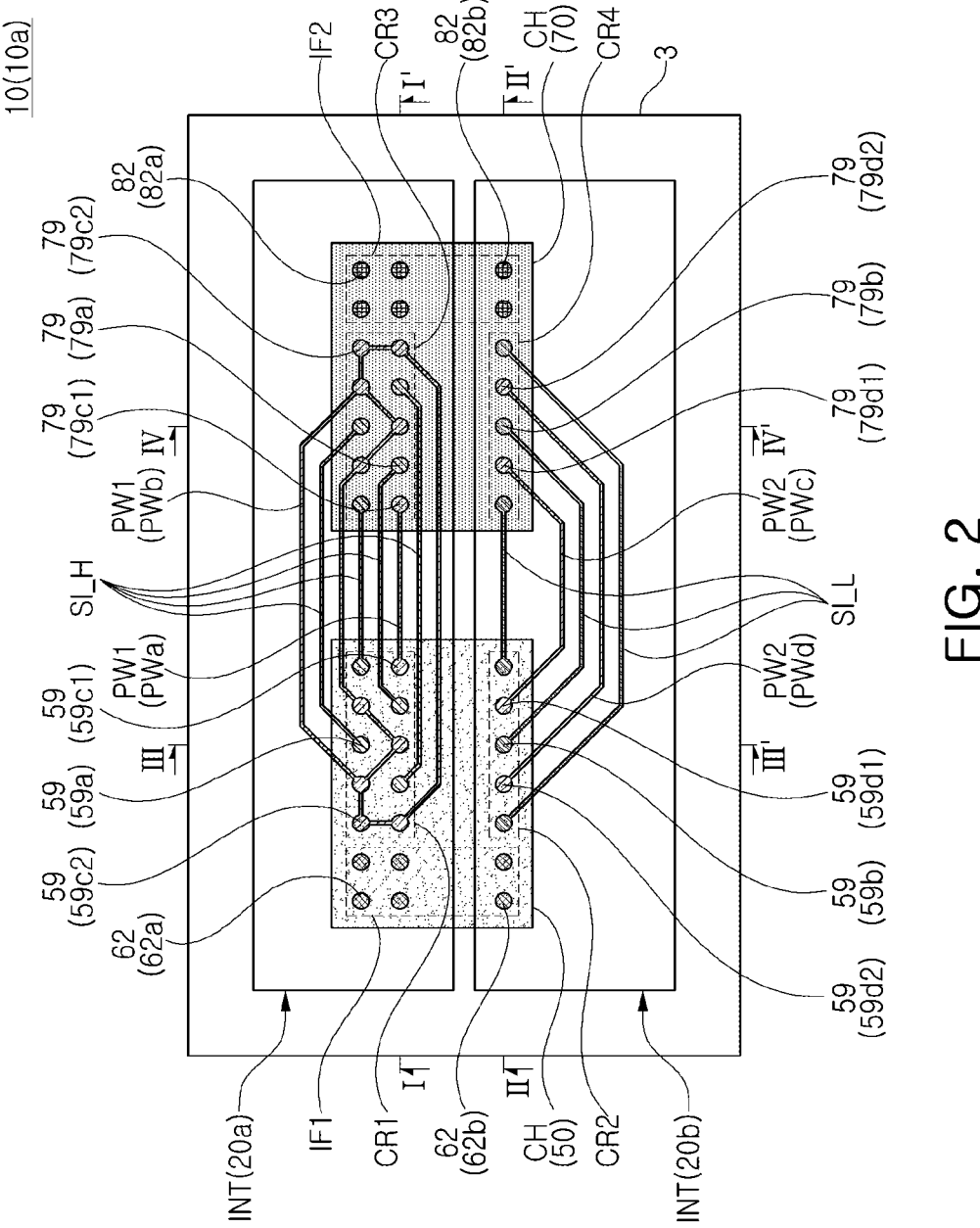
FIG. 2 is a top view schematically illustrating a semiconductor package according to some embodiments of the present inventive concept.

The first semiconductor chip structure CH_1 may further include a first interface region IF1. As shown in FIG. 2, the second semiconductor chip structure CH_2 may further include a second interface region IF2.

In another embodiment, the second interface region IF2 of the second semiconductor chip structure CH_2 may be omitted.

The first semiconductor chip structure CH_1 may include a first semiconductor chip, and the second semiconductor chip structure CH_2 may include a second semiconductor chip including circuit regions configured to communicate with the first semiconductor chip at different rates. For example, the first semiconductor chip structure CH_1 may include a controller semiconductor chip, and the second semiconductor chip structure CH_2 may include at least one memory semiconductor chip. For example, the second semiconductor chip structure CH_2 may include a volatile memory semiconductor chip, such as a DRAM or a non-volatile memory semiconductor chip, such as a flash memory.

The first semiconductor chip structure CH_1, that is, the controller semiconductor chip, may be configured to communicate data with the second semiconductor chip structure CH_2, that is, the memory semiconductor chip, through the first signal paths SI_H of the first interposer INT_1 at a high speed, and the second semiconductor chip structure CH_2 may receive command and address signals from the controller semiconductor chip CH_1 through the second signal paths SI_L of the second interposer INT_2 at a low speed. For example, the first circuit region CR1 of the controller semiconductor chip CH1 may be configured to communicate data with the third circuit region CR3 of the memory semiconductor chip CH_2 at a first rate through the first signal paths SI_H of the first interposer INT_1, and the fourth circuit region CR4 of the memory semiconductor chip CH_2 may receive command and address signals from the second circuit region CR2 of the controller semiconductor chip CH_1 at a second rate slower than the first rate through the second signal paths SI_L of the second interposer INT_2.

The electronic system 1 may further include an electronic device 1000 electrically connected to the semiconductor package 10 by a system bus 1050.

The electronic device 1000 may be a host, and may control general operations of the electronic system 1. For example, a host interface between the electronic device 1000 and the first semiconductor chip structure CH_1 may include various protocols for exchanging data between the electronic device 1000 and the first semiconductor chip structure CH_1. For example, the first semiconductor chip structure CH_1 may communicate with the electronic device 1000 or the outside through at least one of a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI)

protocol, an enhanced small disk interface (ESDI) protocol, and an integrated drive electronics (IDE) protocol, etc.

The electronic system 1 may be one of various components of a system, such as an ultra-mobile PC (UMPC), a workstation, a net-book, a personal digital assistant (PDA), a portable computer, a web tablet, a tablet computer, a wireless phone, a mobile phone, a smartphone, an e-book, a portable multimedia player (PMP), a portable game machine, a navigation device, a black box, a digital camera, a digital multimedia broadcasting (DMB) player, a 3-dimensional television, a digital audio recorder, a digital audio player, a digital picture recorder, a digital picture player, a digital video recorder, a digital video player, a storage constituting a data center, a device that may transmit and receive information in a wireless environment, one of various electronic devices constituting a home network, one of various electronic devices constituting a computer network, one of various electronic devices constituting a telematics network, an RFID device, or one of the various components constituting a computing system.

Figure 3A:
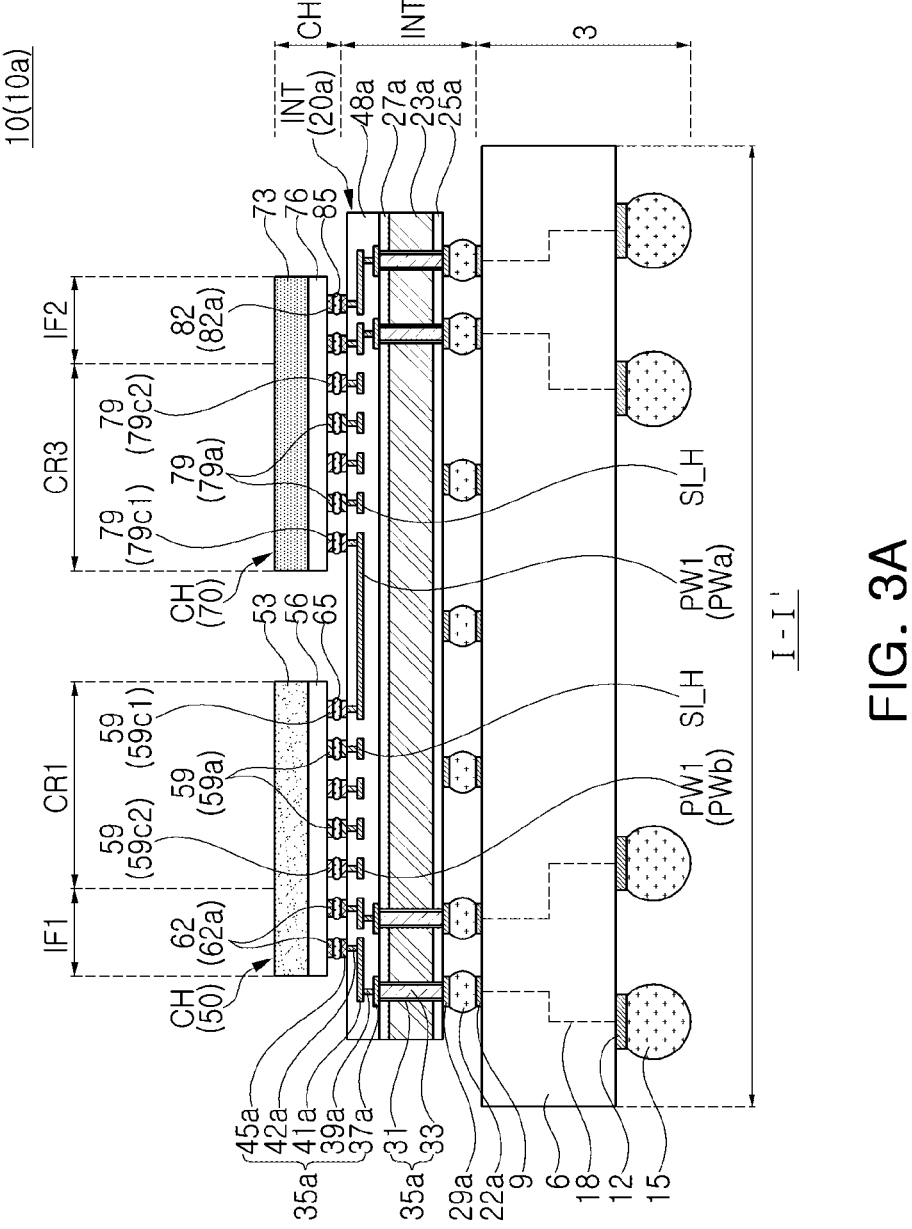
FIGS. 3A to 3C are cross-sectional views schematically illustrating an example of a semiconductor package according to some embodiments of the present inventive concept.
Figure 3B:
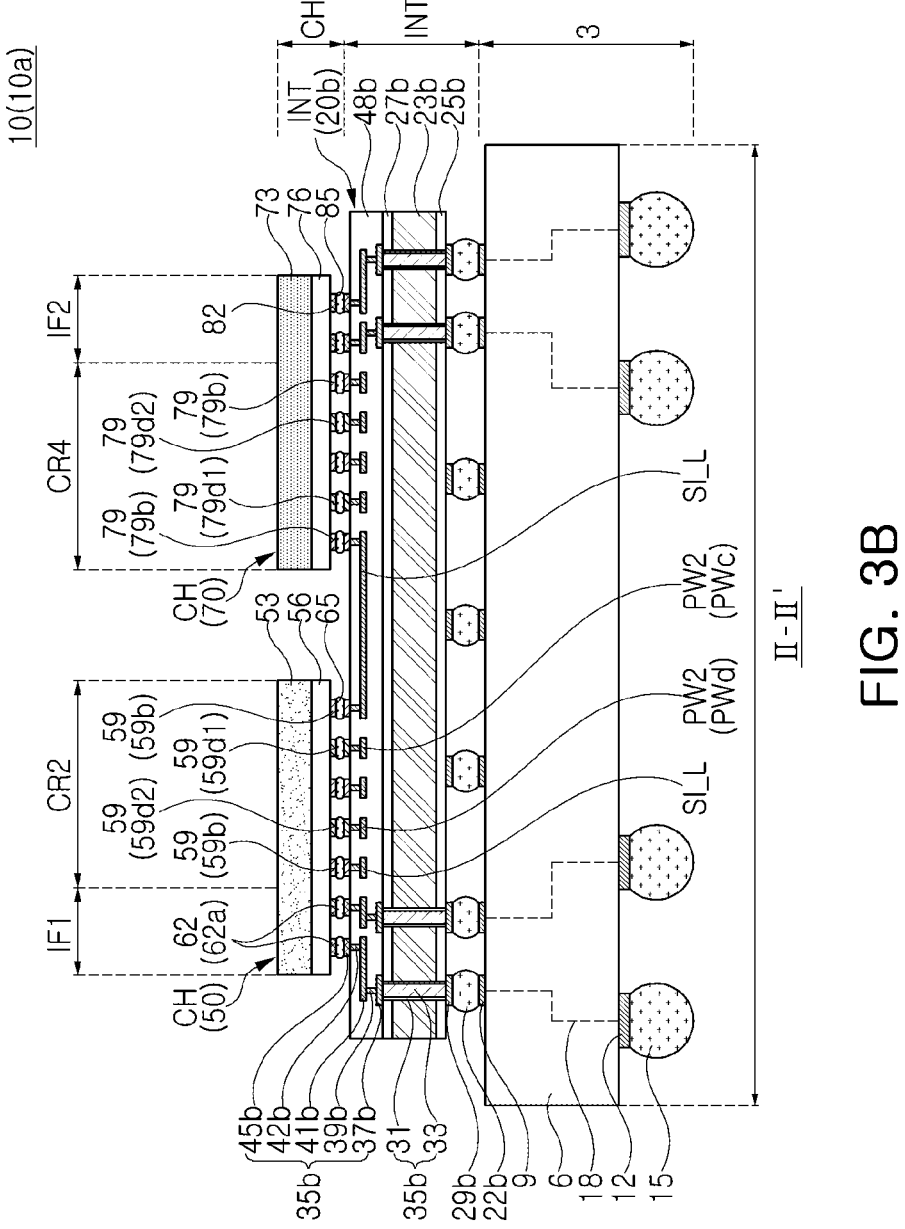
Figure 3C:
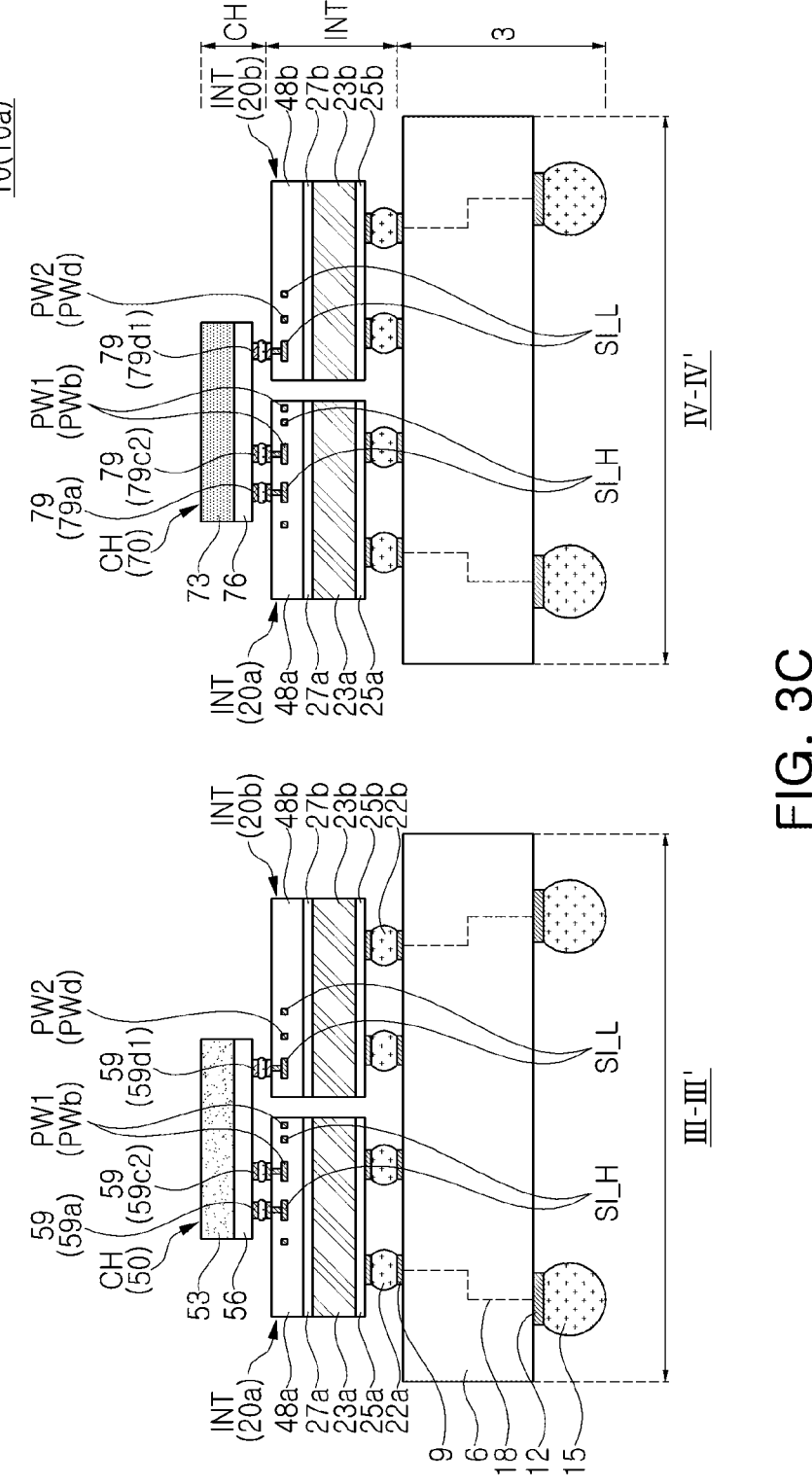

Next, an example of the semiconductor package 10 will be described with reference to FIGS. 2, 3A, 3B, and 3C. FIG. 2 is a top view schematically illustrating the semiconductor package 10 of the electronic system 1 of FIG. 1, and FIG. 3A is a cross-sectional view schematically illustrating a region taken along line I-I' of FIG. 2 to describe an example of the semiconductor package 10 of the electronic system 1 of FIG. 1, FIG. 3B is a cross-sectional view schematically illustrating a region taken along line II-IF of FIG. 2 to describe an example of the semiconductor package 10 of the electronic system 1 of FIG. 1, and FIG. 3C is a cross-sectional view schematically illustrating a region taken along lines and IV-IV' of FIG. 2 to describe an example of the semiconductor package 10 of the electronic system 1 of FIG. 1.

Referring to FIGS. 2, 3A, 3B, and 3C together with FIG. 1, a semiconductor package according to an example embodiment may include the package substrate 3, the plurality of interposers INT, and a plurality of chip structures CH as described above with reference to FIG. 1.

In example embodiments, the package substrate 3 may include a substrate body 6, lower pads 12 below the substrate body 6, connection patterns 15 below the lower pads 12 and electrically connected to the lower pads 12, upper pads 9 on the substrate body 6, and an inner interconnection 18 electrically connecting the lower pads 12 to the upper pads 9 in the substrate body 6. The connection patterns 15 may be solder balls including a solder material, such as SnAg or SaAgCu. The package substrate 3 may be a printed circuit board.

In example embodiments, the plurality of interposers INT may include a first interposer 20a and a second interposer 20b mounted on the package substrate 3 and spaced apart from each other. The first interposer 20a may be the first interposer INT_1 of FIG. 1, and the second interposer 20b may be the second interposer INT_2 of FIG. 1.

In example embodiments, each of the plurality of interposers INT may be a silicon interposer.

The first interposer 20a may include the first signal paths SI_H and the first power/ground paths PW1 described above with reference to FIG. 1. The first interposer 20a may further include a first substrate 23a, a first lower insulating layer 25a, a first upper insulating layer 27a, first lower pads 29a, first connection structures comprising a first interconnection structure 35a and a first insulating structure 48a, first conductive bumps 22a, and first through-electrode structures 30a. The first substrate 23a may be formed of, for example, any one of a silicon substrate, an organic substrate, a plastic substrate, and a glass substrate. When the first substrate 23a is a silicon substrate, the first interposer 20a may be referred to as a silicon interposer. When the first substrate 23a is an organic substrate, the first interposer 23a may be referred to as a panel interposer.

The first lower insulating layer 25a may cover a lower surface of the first substrate 23a. The first lower pads 29a may be below the first lower insulating layer 25a. The first upper insulating layer 27a may cover an upper surface of the first substrate 23a.

Each of the first through-electrode structures 30a may include a through-electrode 33 passing through the first substrate 23a, the first lower insulating layer 25a, and the first upper insulating layer 27a and an insulating spacer 31 covering a side surface of the through-electrode 33.

The first connection structures may include a first insulating structure 48a on the first upper insulating layer 27a and a first interconnection structure 35a at least partially positioned in the first insulating structure 48a.

The first interconnection structure 35a may be electrically connected to the first through-electrode structures 30a. At least a portion of the first interconnection structure 35a may be on the same vertical level as that of the first signal paths SI_H and the first power/ground paths PW1. At least a portion of the first interconnection structure 35a may be formed of the same conductive material as that of the first signal paths SI_H and the first power/ground paths PW1. The first signal paths SI_H and the first power/ground paths PW1 may be in the first insulating structure 48a.

At least a portion of the first interconnection structure 35a may be on substantially the same vertical level as that of the first signal paths SI_H and the first power/ground paths PW1.

The first through-electrode structures 30a and the first interconnection structure 35a may be a first interface path electrically connected to the first interface region IF1.

The first interconnection structure 35a may have a single-layer structure or a multilayer structure.

When the first interconnection structure 35a has a multilayer structure, the first interconnection structure 35a may include first lower pads 37a electrically connected to the through-electrodes 33 of the first through-electrode structures 30a, first upper pads 45a on the first insulating structure 48a, first interconnection lines 41an in the first insulating structure 48a, first lower vias 39a between the first interconnection lines 41a and the first lower pads 37a, and first upper vias 42a between the first interconnection lines 41a and the first upper pads 45a.

The first signal paths SI_H and the first power/ground paths PW1 may include line portions on substantially the same vertical level as that of the first interconnection lines 41a, via portions on substantially the same vertical level as that of the first upper vias 42a, and pad portions on substantially the same vertical level as that of the first upper pads 45a.

The second interposer 20b may include the second signal paths SI_L and the second power/ground paths PW2 described above with reference to FIG. 1. The second signal paths SI_L may be on substantially the same vertical level as that of the first signal paths SI_H. The second interposer 20b may further include a second substrate 23b, a second lower insulating layer 25b, a second upper insulating layer 27b, second lower pads 29b, second connection structures comprising a second interconnection structure 35b and a second insulating structure 48b, second conductive bumps 22b, and second through-electrode structures 30b. The second substrate 23b may be formed of the same material as that of the first substrate 23a. The second lower insulating layer 25b may cover a lower surface of the second substrate 23b. The second lower pads 29b may be below the second lower insulating layer 25b. The second upper insulating layer 27b may cover an upper surface of the second substrate 23b.

Each of the second through-electrode structures 30b may include a through-electrode 33 passing through the second substrate 23b, the second lower insulating layer 25b, and the second upper insulating layer 27b and an insulating spacer 31 covering a side surface of the through-electrode 33.

The second connection structures may include a second insulating structure 48b on the second upper insulating layer 27b and a second interconnection structure 35b at least partially positioned in the second insulating structure 48b.

At least a portion of the second interconnection structure 35b may be on substantially the same vertical level as the second signal paths SI_L and the second power/ground paths PW2.

The second through-electrode structures 30b and the second interconnection structure may be a second interface path electrically connected to the first interface region IF1.

The second interconnection structure 35b may have a single-layer structure or a multilayer structure.

When the second interconnection structure 35b has a multilayer structure, the second interconnection structure 35b may include second lower pads 37b electrically connected to the through-electrodes 33 of the second through-electrode structures 30b, second upper pads 45b on the second insulating structure 48b, second interconnection lines 41b in the second insulating structure 48b, second lower vias 39b between the second interconnection lines 41b and the second lower pads 37b, and second upper vias 39b between the second interconnection lines 41b and the second upper pads 45b.

The second signal paths SI_L and the second power/ground paths PW2 may include line portions on substantially the same vertical level as that of some of the second interconnection lines 41b, via portions on substantially the same vertical level as that of the second upper vias 42b, and pad portions on substantially the same vertical level as that of the second upper pads 45b. The plurality of semiconductor chip structures CH may include a first semiconductor chip structure 50 and a second semiconductor chip structure 70 spaced apart from each other. The first semiconductor chip structure 50 may be the first semiconductor chip structure CH_1 of FIG. 1, and the second semiconductor chip structure 70 may be the second semiconductor chip structure CH_2 of FIG. 1.

The first semiconductor chip structure 50 may include a first semiconductor chip including the first circuit region CR1 and the second circuit region CR2 as described above with reference to FIG. 1, and the second semiconductor chip structure 70 may include at least one second semiconductor chip including the third circuit region CR3 and the fourth circuit region CR4 as described above with reference to FIG. 1.

In example embodiments, the first semiconductor chip of the first semiconductor chip structure 50 may include a first semiconductor substrate 53 and a first region 56 below the first semiconductor substrate 53 and constituting the first and second circuit regions CR1 and CR2.

In example embodiments, the at least one second semiconductor chip of the second semiconductor chip structure 70 may include a second semiconductor substrate 73 and a second region 76 below the second semiconductor substrate 73 and constituting the third and fourth circuit regions CR3 and CR4.

Pads may be below the first region 56, and pads may be below the second region 76.

The pads below the first region 56 of the first semiconductor chip structure 50 may include first signal pads 59a electrically connected to the first signal paths SI_H, second signal paths 59b electrically connected to the second signal paths SI_L, first power pads 59c1 electrically connected to the first power paths PWa of the first power/ground paths PW1, first ground pads 59c2 electrically connected to the first ground paths PWb of the first power/ground paths PW1, second power pads 59d1 electrically connected to the second power paths PWb of the second power/ground paths PW2, and second ground pads 59c2 electrically connected to the second ground paths PWd of the second power/ground paths PW2.

The pads below the first region 56 of the first semiconductor chip structure 50 may further include first and second interface pads 62. The first and second interface pads 62 may include first interface pads 62a overlapping the first interposer 20a and second interface pads 62b overlapping the second interposer 20b.

In the first semiconductor chip structure 50, any one of the first interface pads 62a and the second interface pads 62b may be omitted.

The pads below the second region 76 of the second semiconductor chip structure 70 may include third signal pads 79a electrically connected to the first signal paths SI_H, fourth signal pads 79b electrically connected to the second signal paths SI_L, third power pads 99c1 electrically connected to the first power paths PWa of the first power/ground paths PW1, third ground pads 79c2 electrically connected to the first ground paths PWb of the first power/ground paths PW1, fourth power pads 79d1 electrically connected to the second power paths PWb of the second power/ground paths PW2, and fourth ground pads 79c2 electrically connected to the second ground paths PWd of the second power/ground paths PW2.

The pads below the second region 76 of the second semiconductor chip structure 70 may further include third and fourth interface pads 82. The third and fourth interface pads 82 include third interface pads 82a overlapping the first interposer 20a and fourth interface pads 82b overlapping the second interposer 20b.

In the second semiconductor chip structure 70, any one of the third interface pads 82a and the fourth interface pads 82b may be omitted.

In the second semiconductor chip structure 70, the third and fourth interface pads 82a and 82b may be omitted.

The first semiconductor chip structure 50 may further include conductive bumps 65 below the pads 59 and 62 and electrically connected to and contacting the first and second upper pads 45a and 45b of the first and second interposers 20a and 20b. The second semiconductor chip structure 70 may further include conductive bumps 85 electrically connected to and contacting the first and second upper pads 45a and 45b.

The first and second semiconductor chip structures 50 and 70 may be mounted on the first and second interposers 20a and 20b by the conductive bumps 85 in a flip-chip manner. The first and second interposers 20a and 20b may be mounted on the package substrate 3 by the conductive bumps 22a and 22b in a flip-chip manner.

In some embodiments, at least one of the first and second semiconductor chip structures 50 and 70 may include interface regions IF1 and IF2, at least one of the first and second interposers 20a and 20b may include interface paths including the first interconnection structure 35a and the second interconnection structure 35b electrically connected to the interface regions IF1 and IF2, and at least a portion of the interface paths may be on substantially the same vertical level as that of the first and second signal paths SI_H and SI_L.

Hereinafter, various modified examples of the components of the aforementioned embodiment will be described. Various modified examples of the components of the aforementioned embodiment to be described below will be mainly described with respect to components being modified or components being replaced. In addition, the components that may be modified or replaced described below are described with reference to the following drawings, but the components that may be modified or replaced may be combined with each other or combined with the components described above to implement an electronic system according to some embodiments of the present inventive concept.

The plurality of interposers INT in FIG. 1 described above may be the first and second interposers 20a and 20b, which may be silicon interposers as shown in FIGS. 3A, 3B and 3C, but the embodiments of the present inventive concept are not limited thereto. For example, the first and second interposers 20a and 20b may be modified or replaced with an interposer other than a silicon interposer, for example, a redistribution interposer, and the semiconductor package of an electronic system according to some embodiments of the present inventive concept may be modified to a semiconductor package including interposers that may be modified or replaced.

An example of a redistribution interposer capable of replacing the silicon interposer of the first and second interposers 20a and 20b will be described with reference to FIGS. 4A and 4B, and another example of a redistribution interposer capable of replacing the silicon interposer of the first and second interposers 20a and 20b will be described with reference to FIGS. 5A and 5B.

Figure 4A:
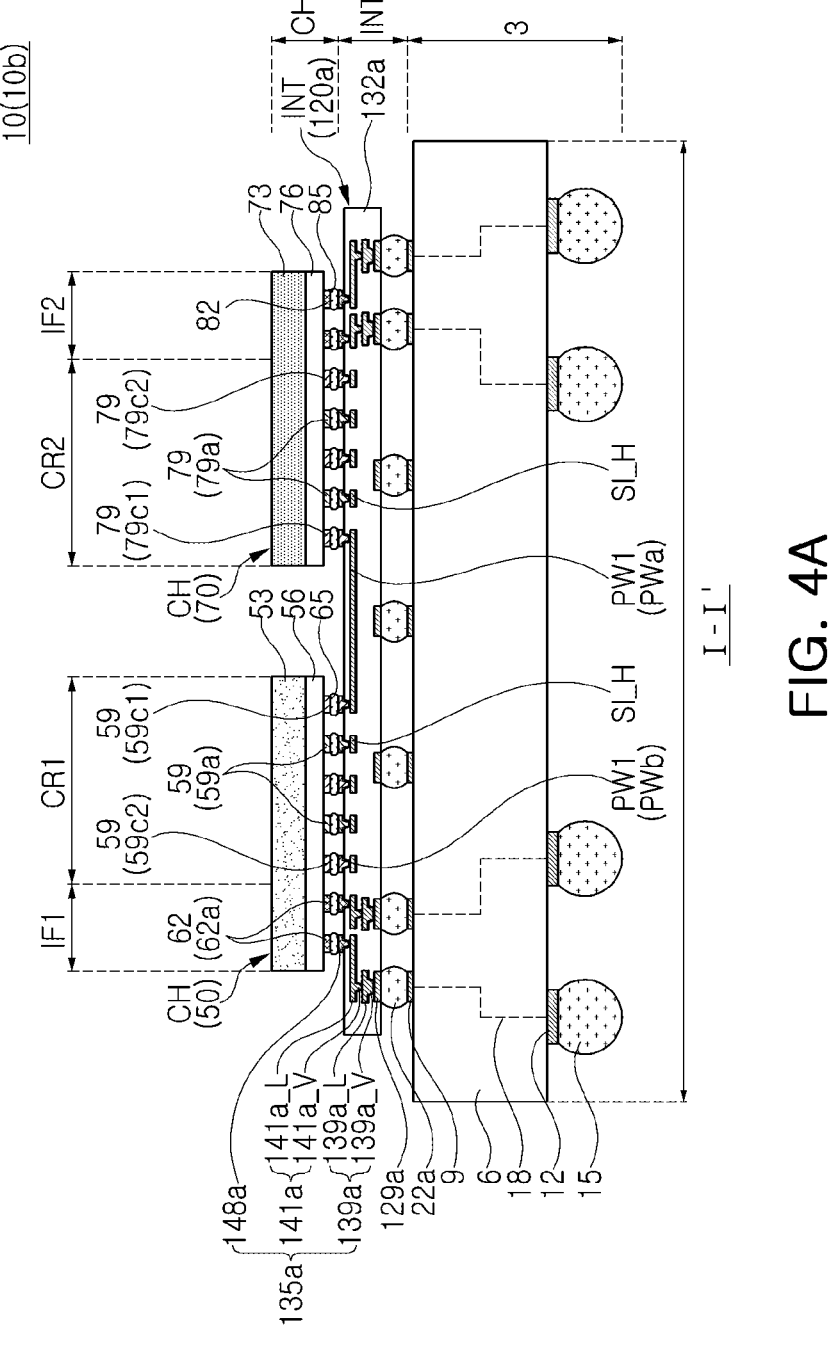
FIGS. 4A and 4B are cross-sectional views schematically illustrating a modified example of a semiconductor package according to some embodiments of the present inventive concept.
Figure 4B:
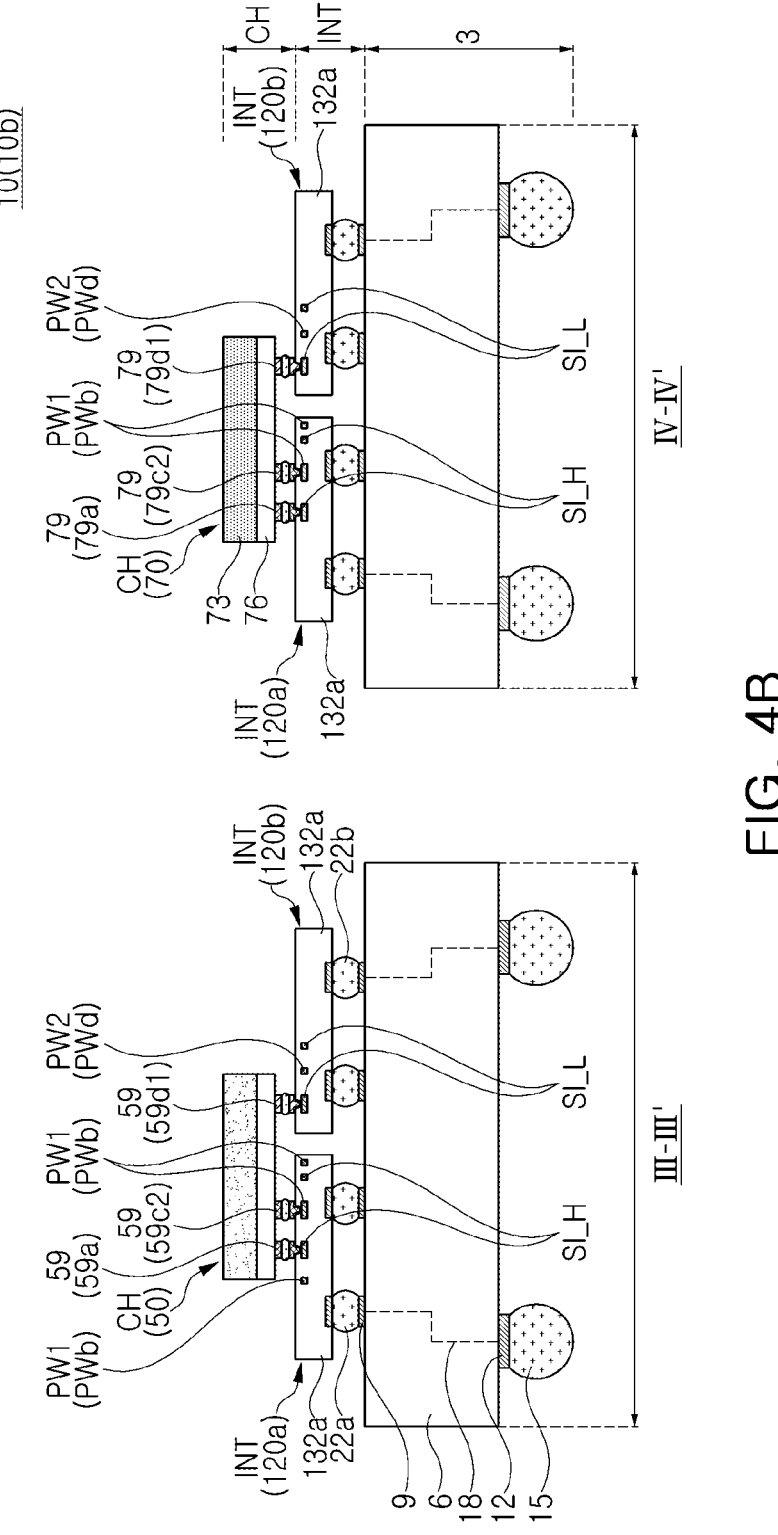

FIGS. 4A and 4B are conceptual cross-sectional views illustrating a redistribution interposer that may replace the silicon interposer of the first and second interposers 20a and described above with reference to FIGS. 3A to 3C. FIG. 4A is a cross-sectional view schematically illustrating a region taken along line I-I' of FIG. 2, and FIG. 4B is a cross-sectional view schematically illustrating a region taken along line III-III' and IV-IV' of FIG. 2.

In a modified example, referring to FIGS. 4A and 4B, a semiconductor package 10b in the modified example may include a first interposer 120a that may replace the first interposer described above with reference to FIGS. 3A to 3C and a second interposer 120b that may replace the second interposer 20b described above with reference to FIGS. 3A to 3C.

The first and second interposers 120a and 120b may be redistribution interposers.

The first interposer 120a may include the first signal paths SI_H and the first power/ground paths PW1 described above with reference to FIG. 1, and the second interposer 120b may include the second signal paths SI_L and the second power/ground paths PW2 described above with reference to FIG. 1. Each of the first and second interposers 120a and 120b may further include an insulating structure 132a, lower pads 129a below the insulating structure 132a, redistribution structures 139a and 141a in the insulating structure 132a, and upper pads 148a on the insulating structure 132a.

At least a portion of the redistribution structures 139a and 141a may be on substantially the same vertical level as those of the first signal paths SI_H, the first power/ground paths PW1, the second signal paths SI_L, and the second power/ground paths PW2. The first signal paths SI_H and the first power/ground paths PW1 may be in the insulating structure 132a of the first interposer 120a, and the second signal paths SI_L and the second power/ground paths PW2 may be in the insulating structure 132a of the second interposer 120b.

The redistribution structures 139a and 141a may include lower redistribution structures 139a and upper redistribution structures 141a on the lower redistribution structures 139a. At least some of the redistribution structures 139a and 141a may include a line portion and a via portion extending from the line portion. For example, each of the lower redistribution structures 139a may include a lower via portion 139V and a lower line portion 139L extending from the lower via portion 139V At least some of the upper redistribution structures 141a may include an upper via portion 141V and an upper line portion 141L extending from the upper via portion 141V.

In example embodiments, some of the upper redistribution structures 141a of the first interposer 120a, for example, the upper line portion 141L, may be on substantially the same vertical level as that of the first signal paths SI_H and the first power/ground paths PW1.

In example embodiments, some of the upper redistribution structures 141a of the second interposer 120b, for example, the upper line portions 141L, may be on substantially the same vertical level as that of the second signal paths SI_L and the second power/ground paths PW2.

The upper pads 148a may be electrically connected to the upper line portions 141L of the upper redistribution structures 141a. The lower redistribution structures 139a may be electrically connected to the lower pads 129a.

In another embodiment, the lower redistribution structures 139a may be omitted, and some of the upper redistribution structures 141a may be electrically connected to and in contact with the lower pads 129a.

Next, a modified example of the semiconductor package of the electronic system according to some embodiments of the present inventive concept will be described with reference to FIGS. 5A and 5B. FIGS. 5A and 5B are conceptual cross-sectional views illustrating a redistribution interposer that may replace the silicon interposer of the first and second interposers 20a and 20b described above with reference to FIGS. 3A to 3C. FIG. 5A is a cross-sectional view schematically illustrating a region taken along line I-I' of FIG. 2, and FIG. 5B is a cross-sectional view schematically illustrating a region taken along lines and IV-IV' of FIG. 2.

Figure 5A:
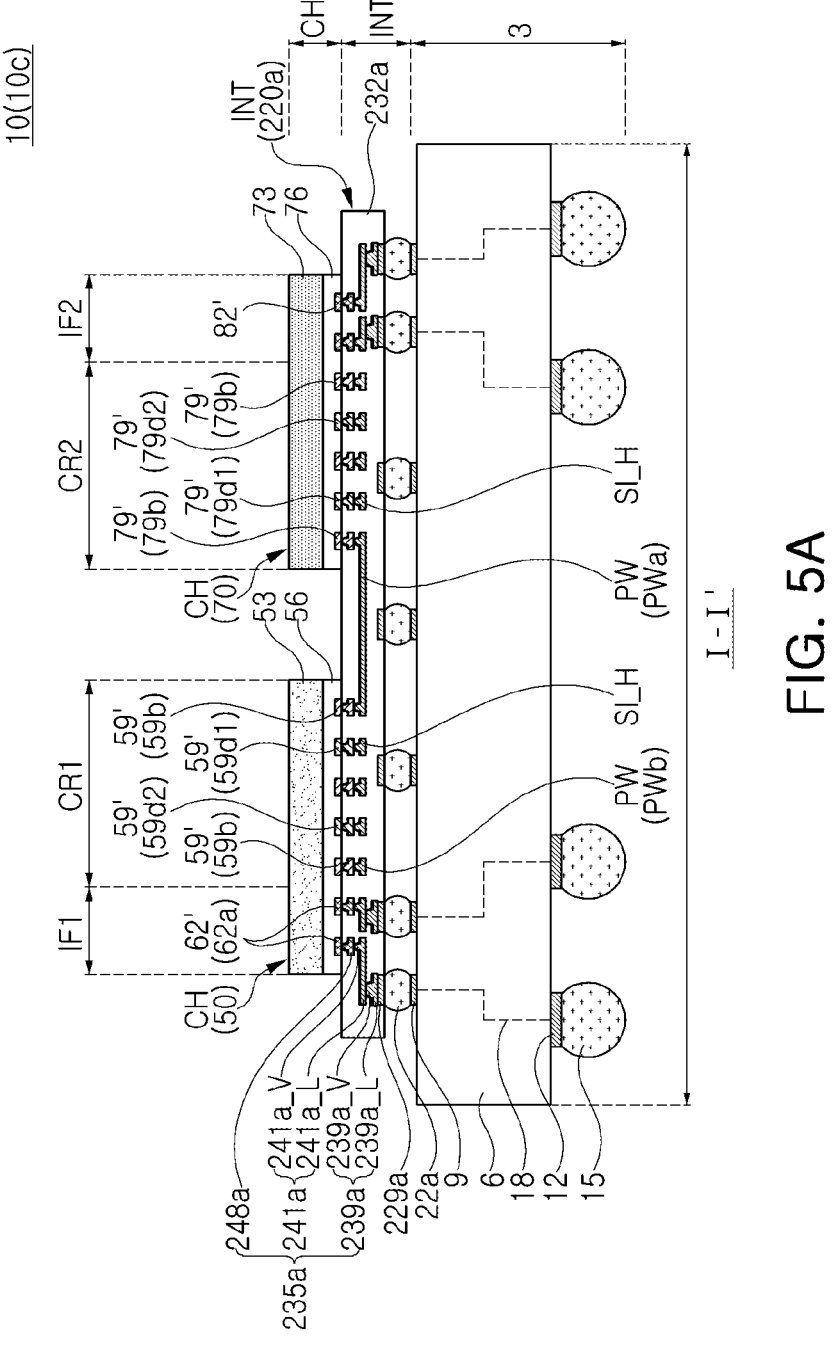
FIGS. 5A and 5B are cross-sectional views schematically illustrating a modified example of a semiconductor package according to some embodiments of the present inventive concept.
Figure 5B:
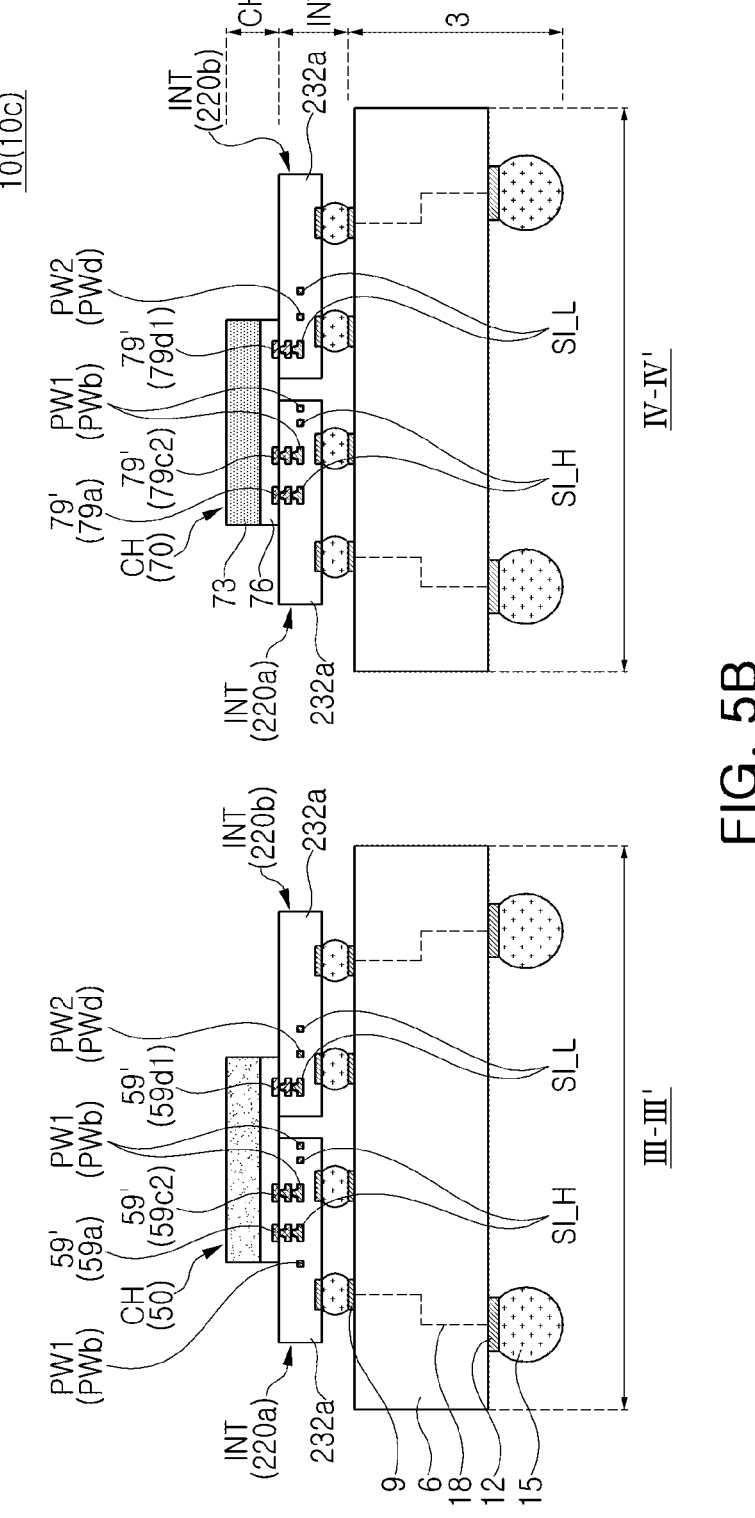

In a modified example, referring to FIGS. 5A and 5B, a semiconductor package 10c in a modified example may include a first interposer 220a that may replace the first interposer described above with reference to FIGS. 3A to 3C and a second interposer 220b that may replace the second interposer 20b described above with reference to FIGS. 3A to 3C.

The first and second interposers 220a and 220b may be redistribution interposers.

The first interposer 220a may include the first signal paths SI_H and the first power/ground paths PW1 described above with reference to FIG. 1, and the second interposer 220b may include the second signal paths SI_L and the second power/ground paths PW2 described above with reference to FIG. 1. Each of the first and second interposers 220a and 220b may further include an insulating structure 232a, lower pads 229a below the insulating structure 232a, redistribution structures 239a and 241a in the insulating structure 232a, and upper pads 448a on the insulating structure 232a.

At least a portion of the redistribution structures 239a and 241a may be on substantially the same vertical level as that of the first signal paths SI_H, the first power/ground paths PW1, the second signal paths SI_L, and the second power/ground paths PW2. The first signal paths SI_H and the first power/ground paths PW1 may be in the insulating structure 232a of the first interposer 220a, and the second signal paths SI_L and the second power/ground paths PW2 may be in the insulating structure 232a of the second interposer 220b.

The redistribution structures 239a and 241a may include lower redistribution structures 239a and upper redistribution structures 241a on the lower redistribution structures 239a.

Each of the lower redistribution structures 239a may include a lower via portion 239V and a lower line portion 239L extending from the lower via portion 239V below the lower via portion 239V.

At least some of the upper redistribution structures 241a may include an upper via portion 241V and an upper line portion 241L extending downwardly from the upper via portion 241V.

In example embodiments, some of the upper redistribution structures 241a of the first interposer 220a, for example, the upper line portions 241L, may be on substantially the same vertical level as that of the first signal paths SI_H and the first power/ground paths PW1.

In example embodiments, some of the upper redistribution structures 241a of the second interposer 220b, for example, the upper line portions 241L, may be on substantially the same vertical level as that of the second signal paths SI_L and the second power/ground paths PW2.

The upper pads 248a may be electrically connected to the upper via portions 241V of the upper redistribution structures 241a. The lower redistribution structures 239a may be electrically connected to the lower pads 229a.

In another embodiment, the lower redistribution structures 239a may be omitted, and some of the upper redistribution structures 241a may be electrically connected to and in contact with the lower pads 229a.

In the first semiconductor chip structure 50, the pads 59 and 62 of FIGS. 3A to 3C may be replaced with pads 59' and 62' having a lower surface coplanar with a lower surface of the first region 56. In the second semiconductor chip structure 70, the pads 79 and 82 of FIGS. 3A to 3C may be replaced with pads 79' and 82' having a lower surface coplanar with the lower surface of the second region 76.

The pads 59', 62', 79', and 82' of the first and second semiconductor chip structures 50 and 70 may be electrically connected and in contact with the upper pads 248a of the first and second interposers 220a and 220b.

Figure 6:
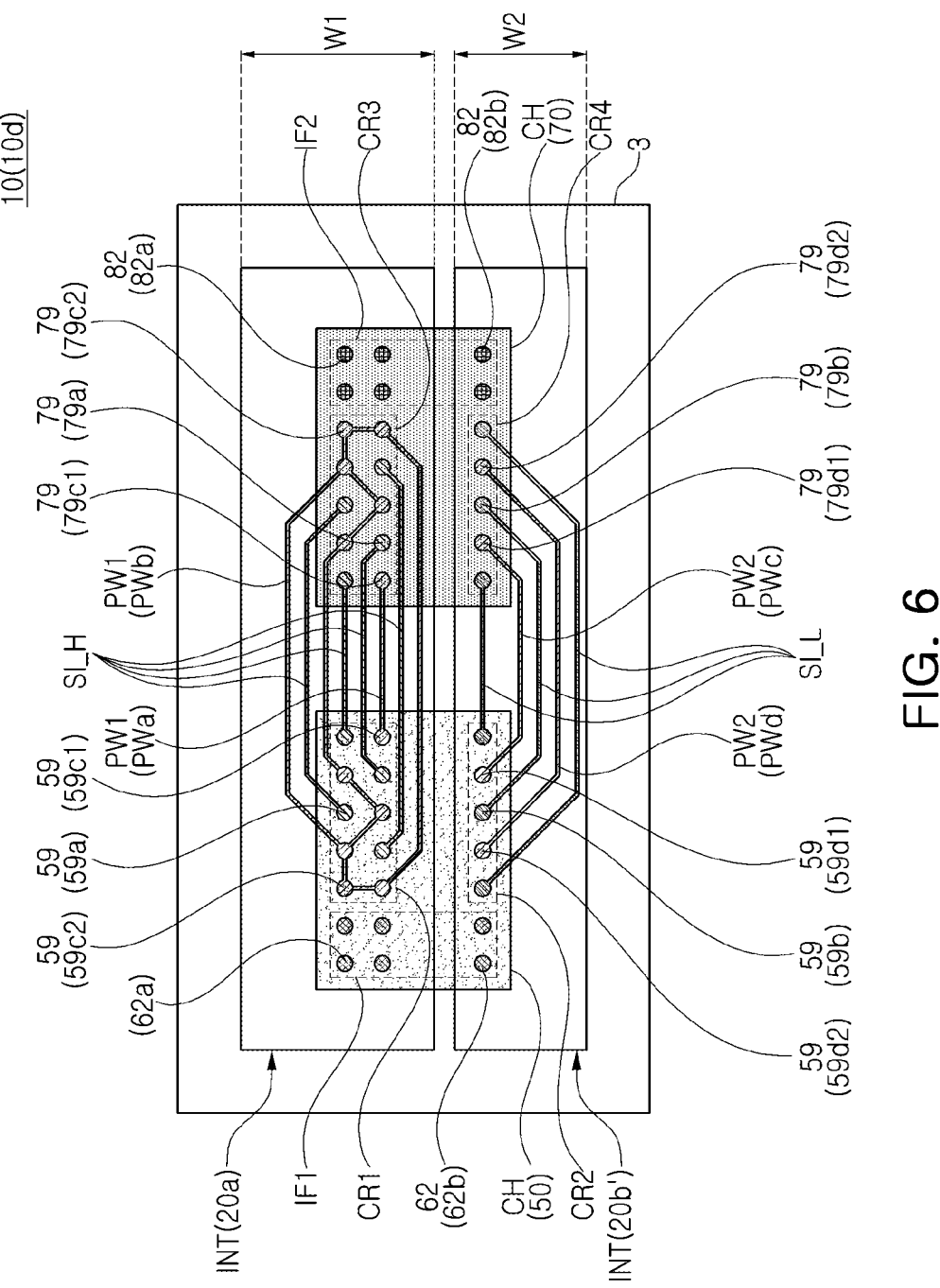
FIG. 6 is a top view schematically illustrating a modified example of a semiconductor package according to some embodiments of the present inventive concept.

In the aforementioned embodiment, the second interposer 20b in FIG. 2 may have the same length and the same width as those of the first interposer 20a, but the embodiment of the present inventive concept is not limited thereto. For example, the second interposer 20b having the same size as the first interposer 20a as shown in FIG. 2 may be replaced with a second interposer having a different size from the first interposer 20a. Hereinafter, an example of a second interposer having a size different from that of the first interposer 20a will be described with reference to FIG. 6. FIG. 6 is a conceptual top view illustrating example embodiments of a semiconductor package including a second interposer having a size different from that of the first interposer 20a of FIG. 2.

In a modified example, referring to FIG. 6, the semiconductor package 10d in the modified example may include a second interposer 20b' having a size different from that of the first interposer 20a described above with reference to FIG. 2. For example, the second interposer 20b' may have the same length as that of the first interposer 20a, and may have a different width from that of the first interposer 20a. For example, the width of the second interposer 20b' may be smaller than the width of the first interposer 20a.

The second interposer 20b' may be an interposer having a reduced width than the second interposer 20b in FIG. 2, and the components of the second interposer 20b' may be substantially the same as those of the second interposer 20b in FIG. 2.

The first and second interposers 20a and 20b' may be a silicon interposer as shown in FIGS. 3A to 3C, a redistribution interposer as shown in FIGS. 4A and 4B, or a redistribution interposer as shown in FIGS. 5A and 5B.

Figure 7:
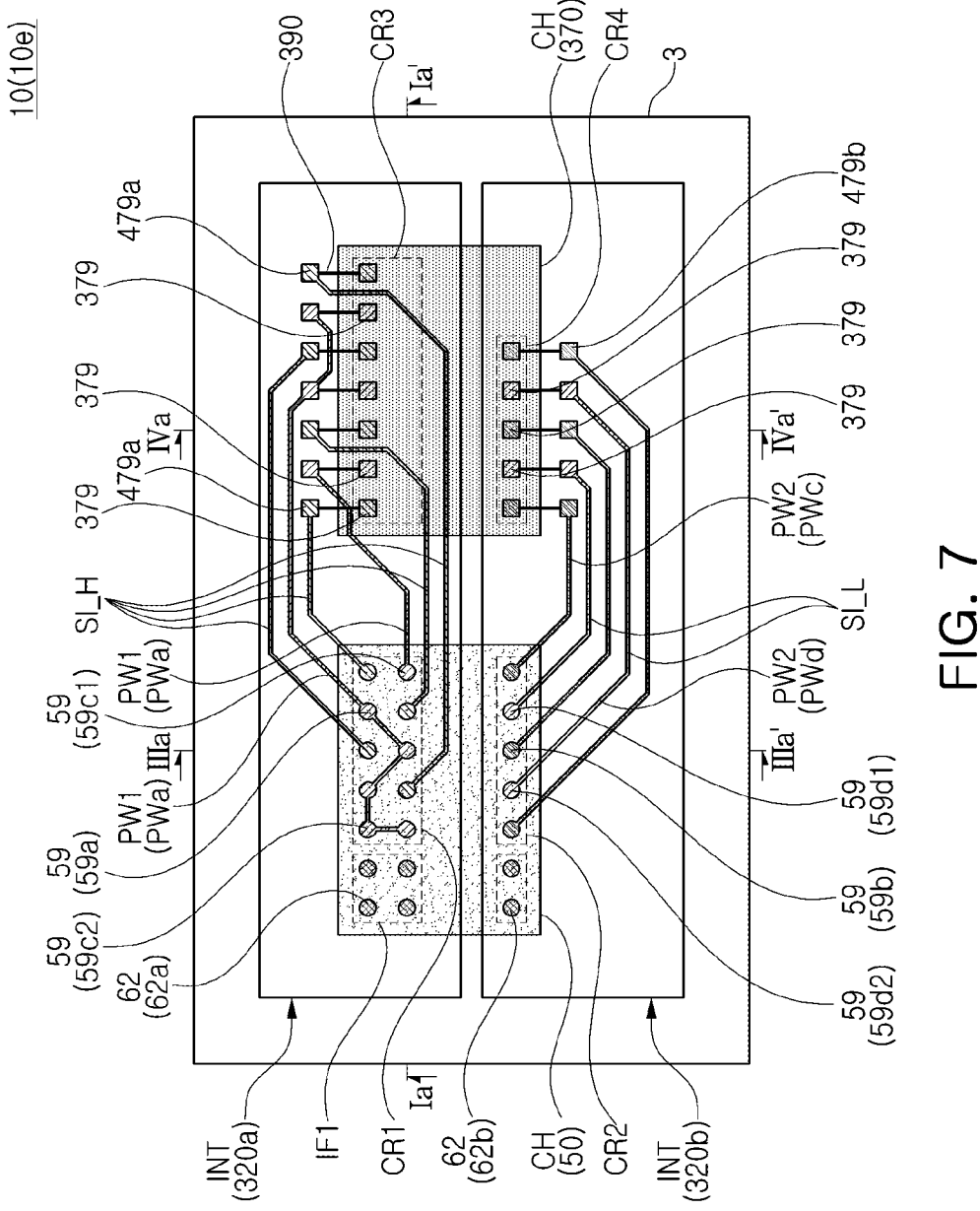
FIG. 7 is a top view schematically illustrating a modified example of a semiconductor package according to some embodiments of the present inventive concept.

Next, a modified example of the semiconductor package of the electronic system according to some embodiments of the present inventive concept will be described with reference to FIG. 7. FIG. 7 is a top view schematically illustrating a modified example of the semiconductor package of the electronic system according to some embodiments of the present inventive concept.

In a modified example, referring to FIG. 7, in a semiconductor package 10e in the modified example, at least one of the plurality of semiconductor chip structures CH on the plurality of interposers INT may be mounted on the plurality of interposers INT by a wire bonding method. For example, the first semiconductor chip structure 50 among the plurality of semiconductor chip structures CH may be mounted on the plurality of interposers INT by a flip chip bonding method or a direct bonding method as shown in FIG. 2, and the second semiconductor chip structure 370 among the plurality of semiconductor chip structures CH may be mounted on the plurality of interposers INT by a wire bonding method. For example, as shown in FIGS. 3A and 3B, the first semiconductor chip structure 50 may be mounted on the plurality of interposers INT by a flip-chip bonding method, and the second semiconductor chip structure 370 may be mounted on the plurality of interposers INT by a wire bonding method, as shown in FIGS. 3A and 3B.

The plurality of interposers INT may include a first interposer 320a and a second interposer 320b mounted on the package substrate 3 and spaced apart from each other. The second semiconductor chip structure 370 may include chip pads 379, the first interposer 320a may include first substrate pads 479a, and the second interposer 320b may include second substrate pads 479b. The chip pads 379 and the first substrate pads 479a, and the chip pads 379 and the second substrate pads 479b may be electrically connected to each other by bonding wires 390.

The second semiconductor chip structure 370 may include the third circuit region CR3 and the fourth circuit region CR4 as described with reference to FIGS. 1 and 2.

The first interposer 320a may include the first power/ground paths PW1 and the first signal paths SI_H as shown in FIGS. 1 and 2. The second interposer 320b may include the second power/ground paths PW2 and the second signal paths SI_L as shown in FIGS. 1 and 2.

The first substrate pads 479a of the first interposer 320a may be electrically connected to the first power/ground paths PW1 and the first signal paths SI_H as shown in FIG. 2. The second substrate pads 479b of the second interposer 320b may be electrically connected to the second power/ground paths PW2 and the second signal paths SI_L as shown in FIG. 2.

The third circuit region CR3 of the second semiconductor chip structure 370 may be electrically connected to the first circuit region CR1 of the first semiconductor chip structure through the chip pads 379, the bonding wires 390, the first substrate pads 479a, the first power/ground paths PW1, and the first signal paths SI_H.

The fourth circuit region CR4 of the second semiconductor chip structure 370 may be electrically connected to the second circuit region CR2 of the first semiconductor chip structure 50 through the chip pads 379, the bonding wires 390, the second substrate pads 479b, the second power/ground paths PW2, and the second signal paths SI_L.

As described above with reference to FIG. 1, the third circuit region CR3 may communicate with the first circuit region CR1 at a first rate through the first signal paths SI_H of the first interposer 320a, and the fourth circuit region CR4 may communicate with the second circuit region CR2 at a second rate, slower than the first rate, through the second signal paths SI_L of the second interposer 320b.

Figure 8A:
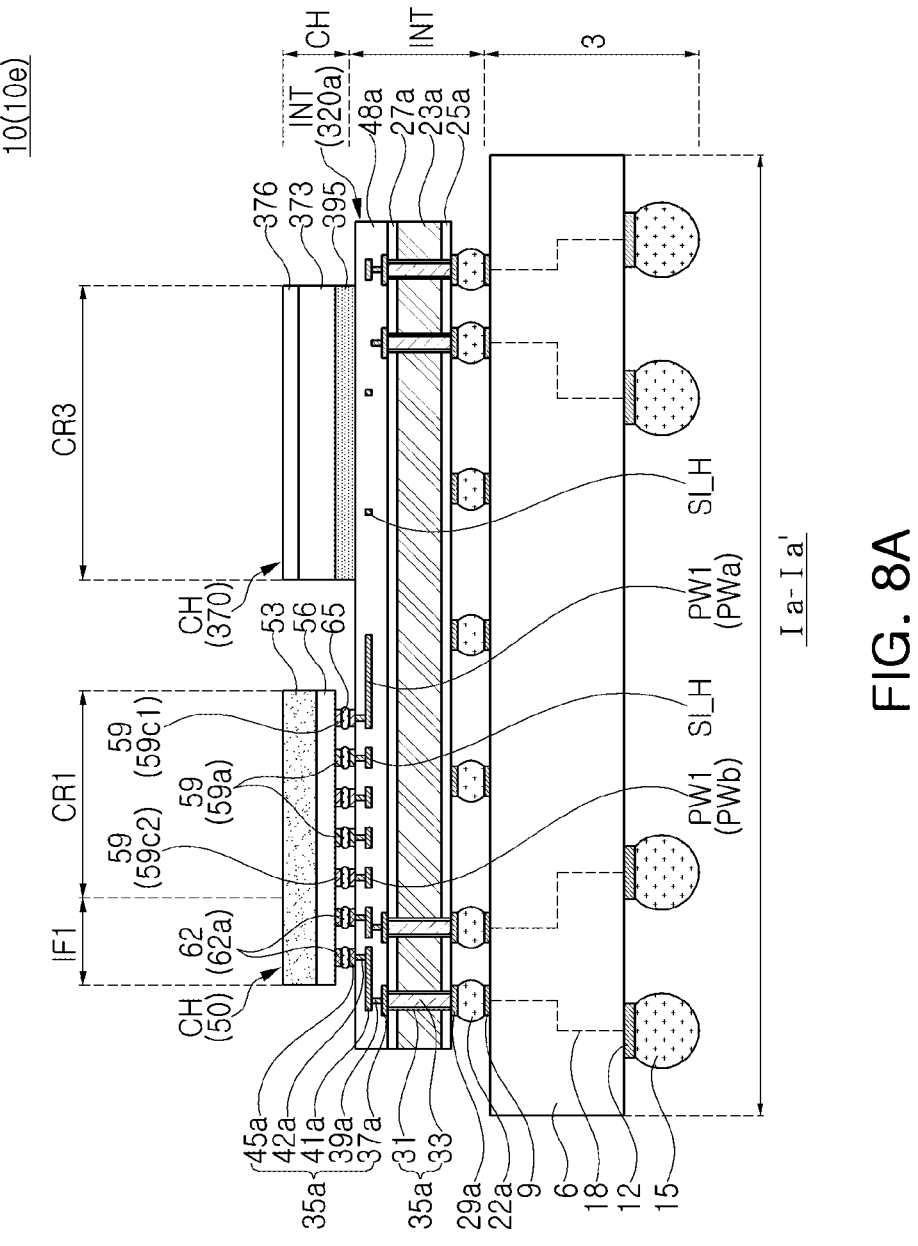
FIGS. 8A and 8B are cross-sectional views schematically illustrating a modified example of a semiconductor package according to some embodiments of the present inventive concept.

The interposers INT may be silicon interposers as shown in FIGS. 3A to 3C, redistribution interposers as shown in FIGS. 4A and 4B, or redistribution interposers as shown in FIGS. 5A and 5B. Hereinafter, an example in which the interposers INT are silicon interposers as shown in FIGS. 3A to 3C will be described with reference to FIGS. 8A and 8B. FIG. 8A is a cross-sectional view schematically illustrating a region taken along line Ia-Ia' of FIG. 7, and FIG. 8B is a cross-sectional view schematically illustrating a region taken along lines and IVa-IVa' of FIG. 7.

Figure 8B:
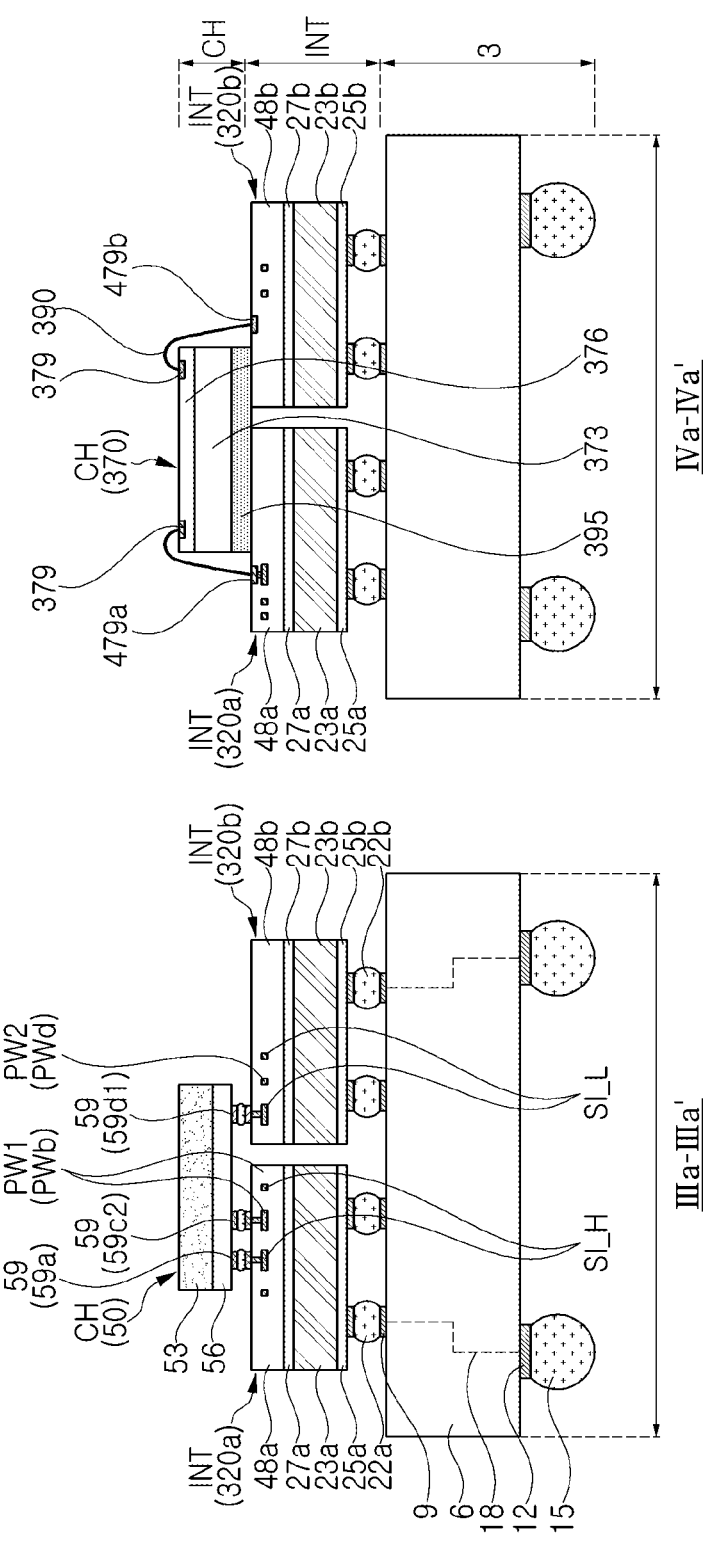

Referring to FIGS. 7, 8A and 8B, in the cross-sectional structure of FIGS. 3A and 3C, the second semiconductor chip structure (FIGS. 3A and 3B) may be mounted on the interposers INT by a flip chip bonding method, and the second semiconductor chip structure 370 described above with reference to FIG. 7 may be mounted on the interposers INT by a wire bonding method.

The first and second interposers 320a and 320b of the interposers INT may be interposers including the first substrate pads 479a and the second substrate pads 479b for wire bonding.

The second semiconductor chip structure 370 may include a semiconductor substrate 373 and a region 376 in which the third and fourth circuit regions (CR3 and CR4 of FIG. 7) are on the semiconductor substrate 373. The second semiconductor chip structure 370 may include chip pads 379 for wire bonding. The chip pads 379 may be on the region 376 of the second semiconductor chip structure 370. The second semiconductor chip structure 370 may be bonded to the interposers INT by an adhesive layer 395. The chip pads 379 of the second semiconductor chip structure 370 and the first and second interposers 320a and 320b may be electrically connected to each other by bonding wires 390.

Figure 9:
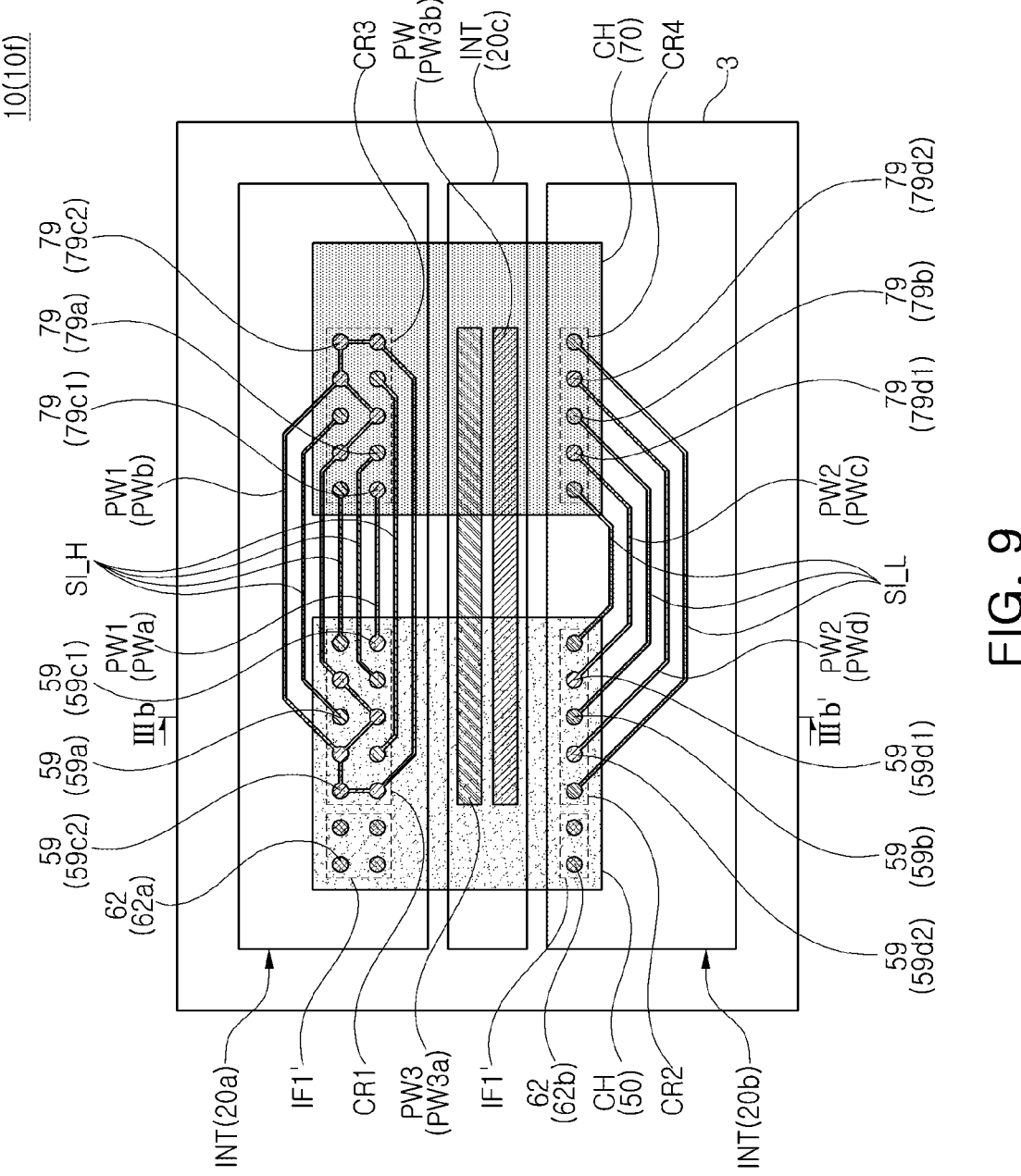
FIG. 9 is a top view schematically illustrating a modified example of a semiconductor package according to some embodiments of the present inventive concept.

Next, a modified example of the semiconductor package of the electronic system according to some embodiments of the present inventive concept will be described with reference to FIG. 9. FIG. 9 is a top view schematically illustrating a modified example of the semiconductor package of the electronic system according to some embodiments of the present inventive concept.

In a modified example, referring to FIG. 9, in a semiconductor package 10f in a modified example, the plurality of interposers INT described above may further include a third interposer 20c. The third interposer 30c may be between the first and second interposers, for example, the first interposer (INT_1 of FIG. 1, 20a of FIG. 2) and the second interposer (INT_2 of FIG. 1, 20b of FIG. 2) as shown in FIGS. 1 and 2. The third interposer 20c may be spaced apart from the first interposer (INT_1 of FIG. 1, 20a of FIG. 2) and the second interposer (INT_2 of FIG. 1, 20b of FIG. 2).

The third interposer 20c may include third power/ground paths PW3 including a third power path PW3a and a third ground path PW3b. For example, the third power paths PW3a may be PLL power more sensitive than the first and second power paths PW1a and PW2c. The third interposer 20c may include the third power paths PW3a of sensitive PLL power, but may not include a signal path for signal transmission.

Figure 10:
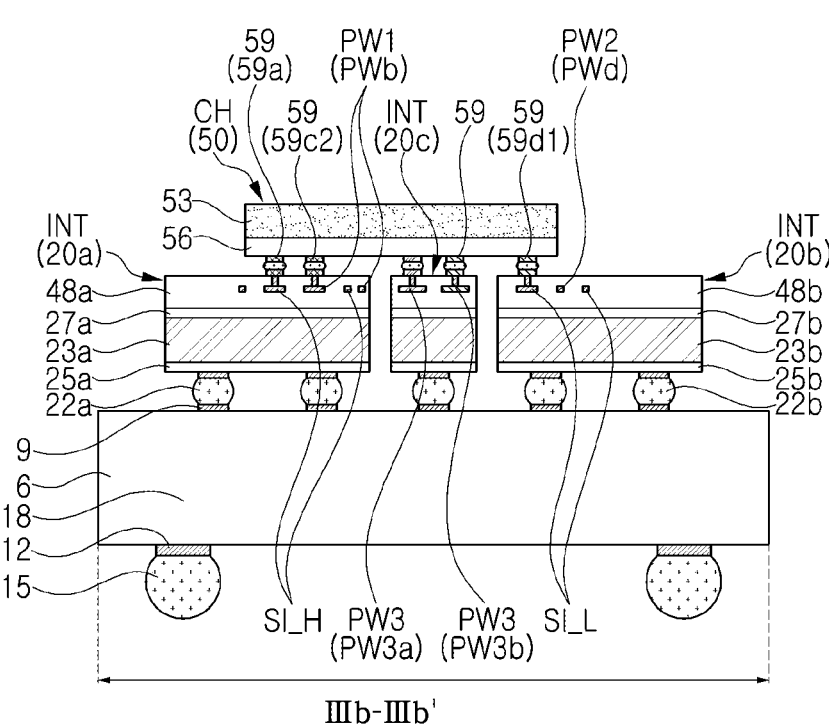
FIG. 10 is a cross-sectional view schematically illustrating a modified example of a semiconductor package according to some embodiments of the present inventive concept.

The interposers INT may be silicon interposers as shown in FIGS. 3A to 3C, redistribution interposers as shown in FIGS. 4A and 4B, or redistribution interposers as shown in FIGS. 5A and 5B. Hereinafter, an example in which the interposers INT are silicon interposers as shown in FIGS. 3A to 3C will be described with reference to FIG. 10. FIG. 10 is a cross-sectional view schematically illustrating a region taken along line IIIb-IIIb' of FIG. 9.

Referring to FIGS. 9 and 10, the third interposer 20c described above with reference to FIG. 9 may be the same silicon interposer as the first and second interposers (20a and 20b of FIG. 3C). For example, the third interposer 30c may be a silicon interposer including the third power/ground paths PW3 described above with reference to FIG. 9, and the third power/ground paths PW3 may be electrically connected to the first and second semiconductor chip structures CH_1 and CH_2.

Figure 11:
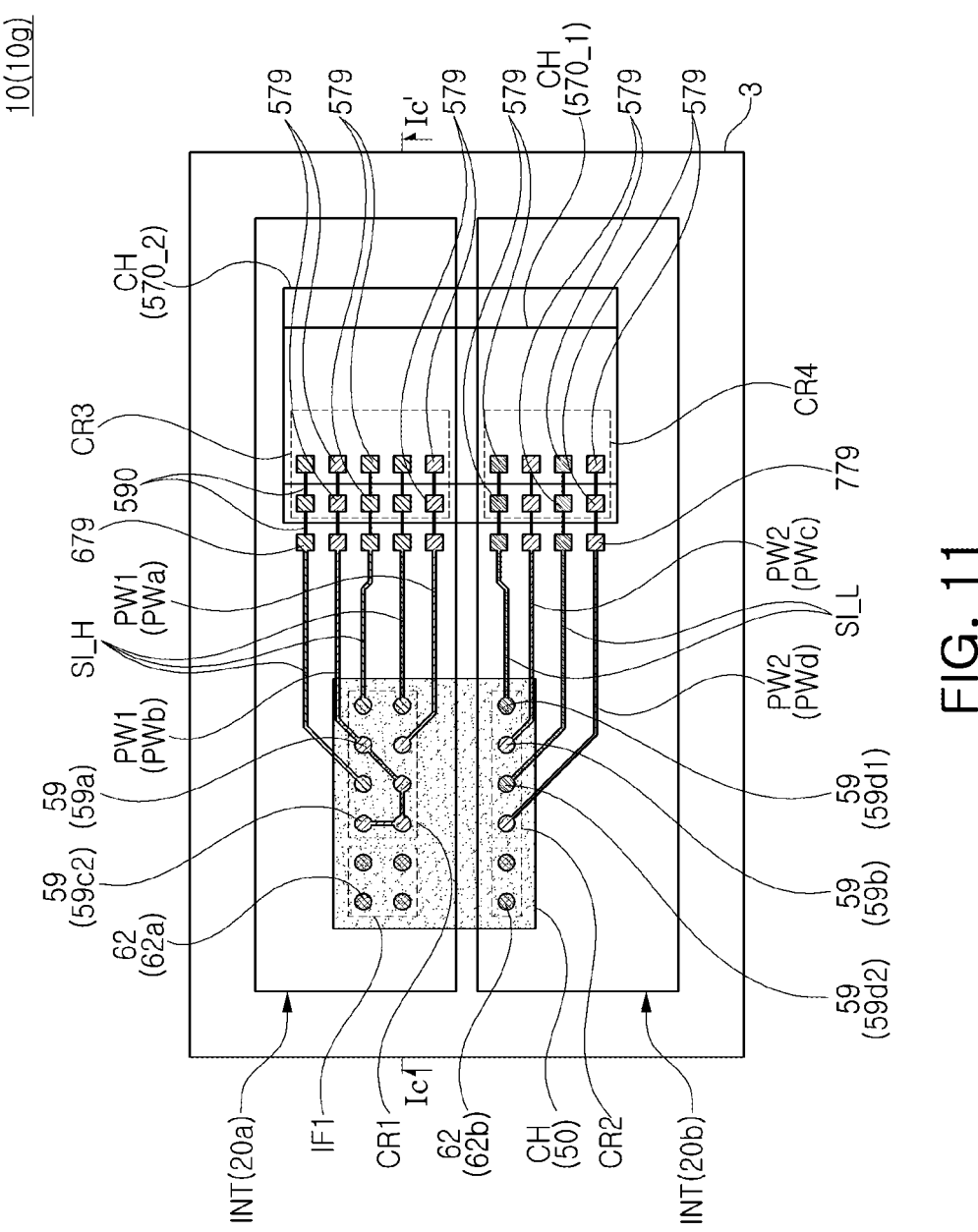
FIG. 11 is a top view schematically illustrating a modified example of a semiconductor package according to some embodiments of the present inventive concept.

Next, a modified example of the semiconductor package of the electronic system according to some embodiments of the present inventive concept will be described with reference to FIG. 11. FIG. 11 is a top view schematically illustrating a modified example of the semiconductor package of the electronic system according to some embodiments of the present inventive concept.

In a modified example, referring to FIG. 11, in a semiconductor package 10g in the modified example, at least one of the plurality of semiconductor chip structures CH on the plurality of interposers INT may be a stacked chip structure which is vertically stacked. For example, the second semiconductor chip structure (370 of FIG. 7) mounted on the interposers INT by a wire bonding method in FIG. 7 may be stacked semiconductor chip structures 570_1 and 570_2 including vertically stacked semiconductor chips as shown in FIG. 11. The stacked chip structures 570_1 and 570_2 may be stacked by a wire bonding method. The stacked chip structures 570_1 and 570_2 may be mounted on the plurality of interposers INT by a wire bonding method. The plurality of interposers INT may include the first and second interposers 20a and 20b.

The stacked chip structures 570_1 and 570_2 may include a first semiconductor chip 570_1 and a second semiconductor chip 570_2 that are sequentially stacked. The first and second semiconductor chips 570_1 and 570_2 may include chip pads 579, the first interposer 20a may include first substrate pads 679, and the second interposer 20a may include second substrate pads 779.

The chip pads 579 of the first and second semiconductor chips 570_1 and 570_2 and the first and second substrate pads 679 and 779 may be electrically connected to each other by bonding wires 590. The first and second semiconductor chips 570_1 and 570_2 may be nonvolatile memory chips, such as NAND flash memory, or volatile memory chips, such as DRAM memory.

Each of the first and second semiconductor chips 570_1 and 570_2 may include the third circuit region CR3 and the fourth circuit region CR4 as described above with reference to FIGS. 1 and 2.

The first interposer 20a may include the first power/ground paths PW1 and the first signal paths SI_H as shown in FIGS. 1 and 2. The second interposer 20b may include the second power/ground paths PW2 and the second signal paths SI_L as shown in FIGS. 1 and 2.

The first substrate pads 679 of the first interposer 20a may be electrically connected to the first power/ground paths PW1 and the first signal paths SI_H as shown in FIG. 2. The second substrate pads 779 of the second interposer 20b may be electrically connected to the second power/ground paths PW2 and the second signal paths SI_L as shown in FIG. 2.

The third circuit region CR3 of each of the first and second semiconductor chips 570_1 and 570_2 may be electrically connected to the first circuit region CR1 of the first semiconductor chip structure 50 through the chip pads 579, the bonding wires 590, the first substrate pads 679, the first power/ground paths PW1, and the first signal paths SI_H.

The fourth circuit region CR4 of each of the first and second semiconductor chips 570_1 and 570_2 may be electrically connected to the second circuit region CR2 of the first semiconductor chip structure 50 through the chip pads 579, the bonding wires 590, the second substrate pads 779, the second power/ground paths PW2, and the second signal paths SI_L.

As described above with reference to FIG. 1, the third circuit region CR3 may communicate with the first circuit region CR1 at a first rate through the first signal paths SI_H of the first interposer 20a, and the fourth circuit region CR4 may communicate with the second circuit region CR2 at a second rate, slower than the first rate, through the second signal paths SI_L of the second interposer 20b.

Figure 12:
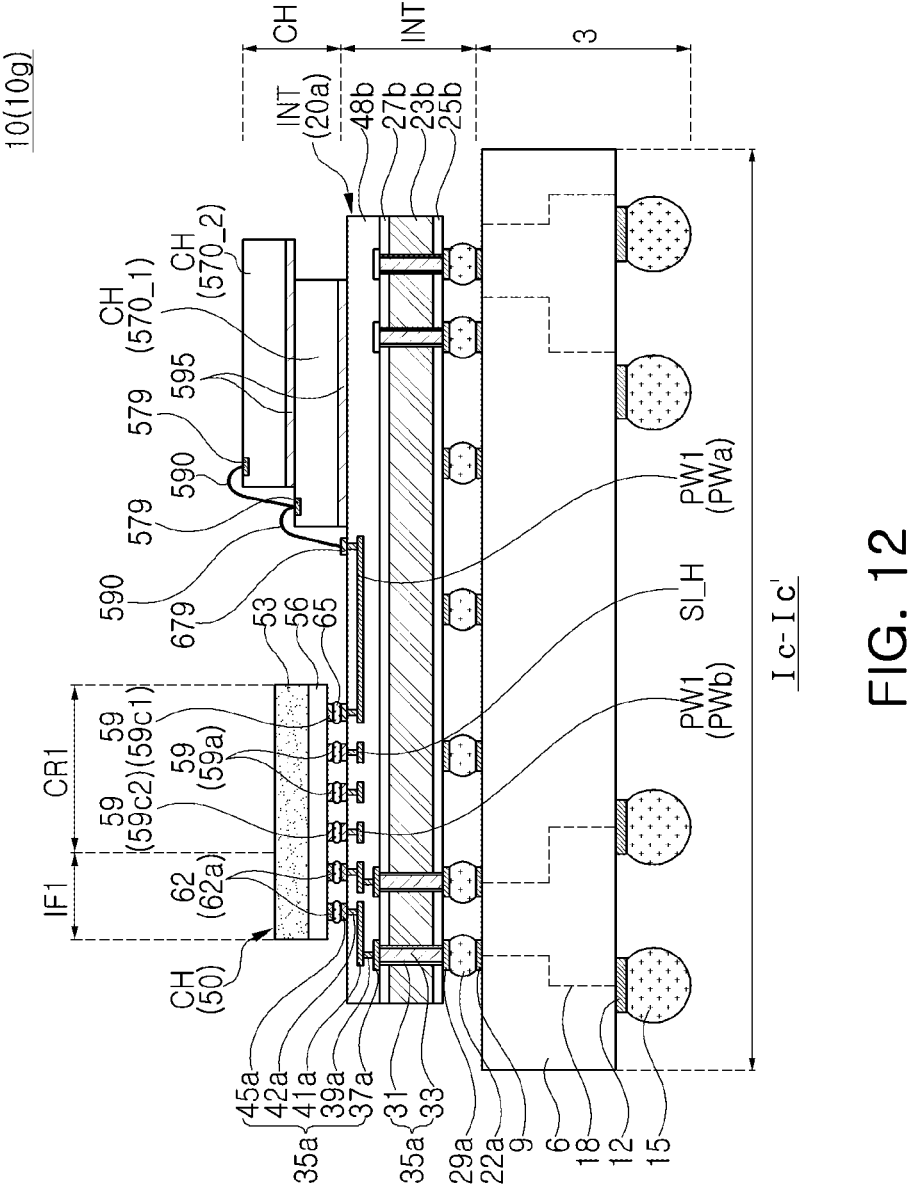
FIG. 12 is a cross-sectional view schematically illustrating a modified example of a semiconductor package according to some embodiments of the present inventive concept.

The interposers INT may be silicon interposers as shown in FIGS. 3A to 3C, redistribution interposers as shown in FIGS. 4A and 4B, or redistribution interposers as shown in FIGS. 5A and 5B. Hereinafter, an example in which the interposers INT are silicon interposers as shown in FIGS. 3A to 3C will be described with reference to FIG. 12. FIG. 12 is a cross-sectional view schematically illustrating a region taken along the line Ic-Ic' of FIG. 11.

Referring to FIGS. 11 and 12, the first semiconductor chip 570_1 may be attached to the first and second interposers 20a and 20b by an adhesive layer 595 covering a lower surface of the first semiconductor chip 570_1, and the second semiconductor chip 570_2 may be attached to the first semiconductor chip 570_1 by the adhesive layer 595 covering a lower surface of the second semiconductor chip 570_2. As described above, the first and second semiconductor chips 570_1 and 570_2 may include the chip pads 579, and the first and second interposers 20a and 20b may include the first and second substrate pads 679. As described above with reference to FIG. 11, the chip pads 579 of the first and second semiconductor chips 570_1 and 570_2 and the first and second substrate pads 679 and 779 may be electrically connected to each other by the bonding wires 590.

Figure 13:
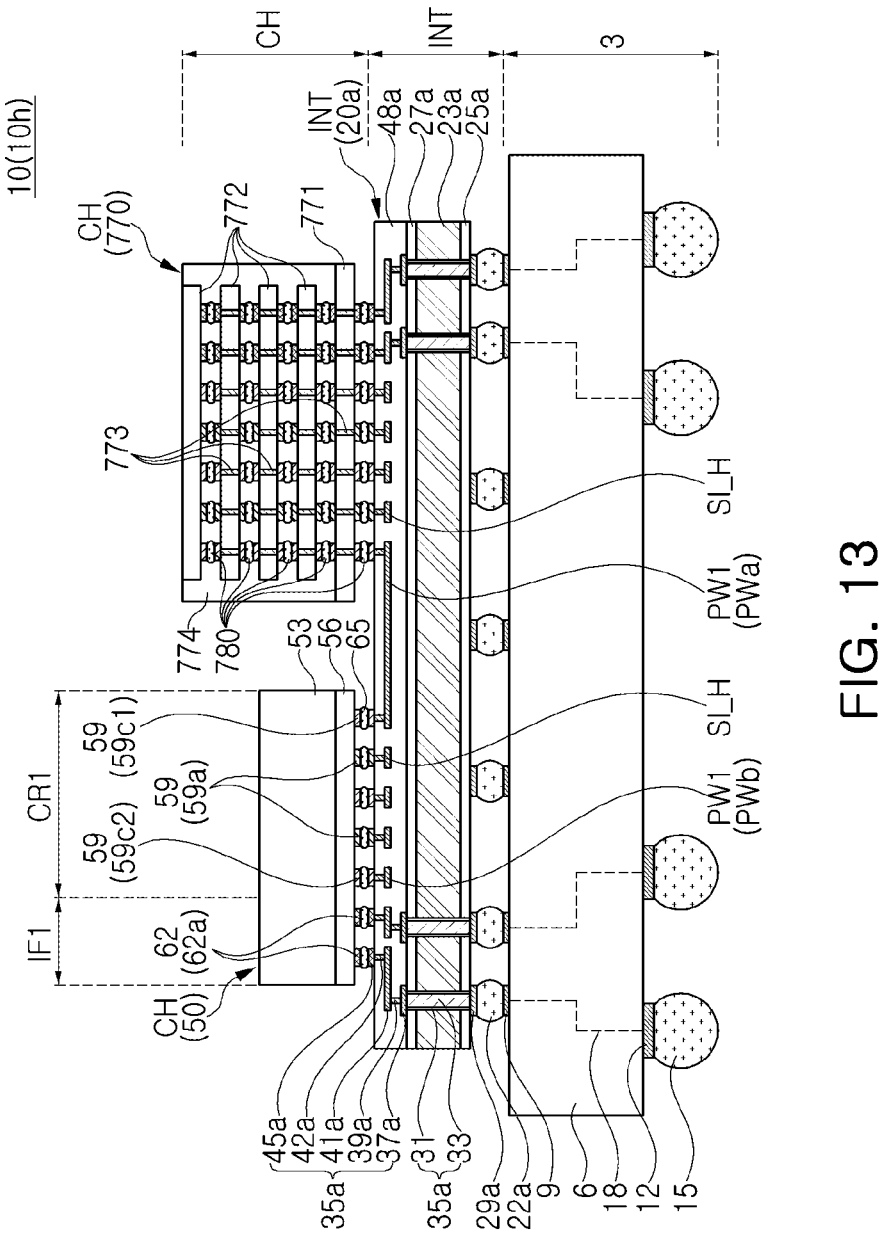
FIG. 13 is a cross-sectional view schematically illustrating a modified example of a semiconductor package according to some embodiments of the present inventive concept.

In FIGS. 11 and 12, at least one of the plurality of semiconductor chip structures CH on the plurality of interposers INT may be stacked chip structures 570_1 and 570_2 stacked by a wire bonding method, but the embodiments of the present inventive concept are not limited thereto. For example, at least one of the plurality of semiconductor chip structures CH on the plurality of interposers INT may be replaced by a stacked chip structure stacked by a method other than the wire bonding method, for example, a flip chip bonding method or a direct bonding method. For example, in FIG. 2, the second semiconductor chip structure 70 may be replaced with a stacked chip structure stacked by a method other than a wire bonding method, for example, a flip chip bonding method or a direct bonding method. Hereinafter, a stacked chip structure that may replace the second semiconductor chip structure 70 in FIGS. 2, 3A, 3B, and 3C will be described with reference to FIG. 13. FIG. 13 is a cross-sectional view illustrating a stacked chip structure that may replace the second semiconductor chip structure in the cross-sectional structure of FIG. 3A.

Referring to FIG. 13, a semiconductor package 10h in the modified example may include a stacked chip structure 770 that may replace the second semiconductor chip structure 70 in FIGS. 2, 3A, 3B, and 3C.

The stacked chip structure 770 may include a lower chip 771 and a plurality of semiconductor chips 772 that are vertically spaced apart from each other and stacked on the lower chip 771.

The stacked chip structure 770 may further include bump structures 780 for interconnecting the lower chip 771 and the plurality of semiconductor chips 772. The lower chip 771 may further include through-electrodes 773 for electrically connecting the plurality of semiconductor chips 772 and the plurality of interposers INT, and chips other than the uppermost semiconductor chip, among the plurality of semiconductor chips 772 may further include through-electrodes 773 for interconnecting the plurality of semiconductor chips 772. The stacked chip structure 770 may further include a mold layer 774 covering lower portions of the plurality of semiconductor chips 772 on the lower chip 771 and covering side surfaces of the plurality of semiconductor chips 772. The stacked chip structure 770 may be mounted on the first and second interposers 20a and 20b using a flip-chip method. The lower chip 771 may be a buffer chip or a logic chip. The plurality of semiconductor chips 772 may be volatile memory chips, such as DRAM memory.

Figure 14:
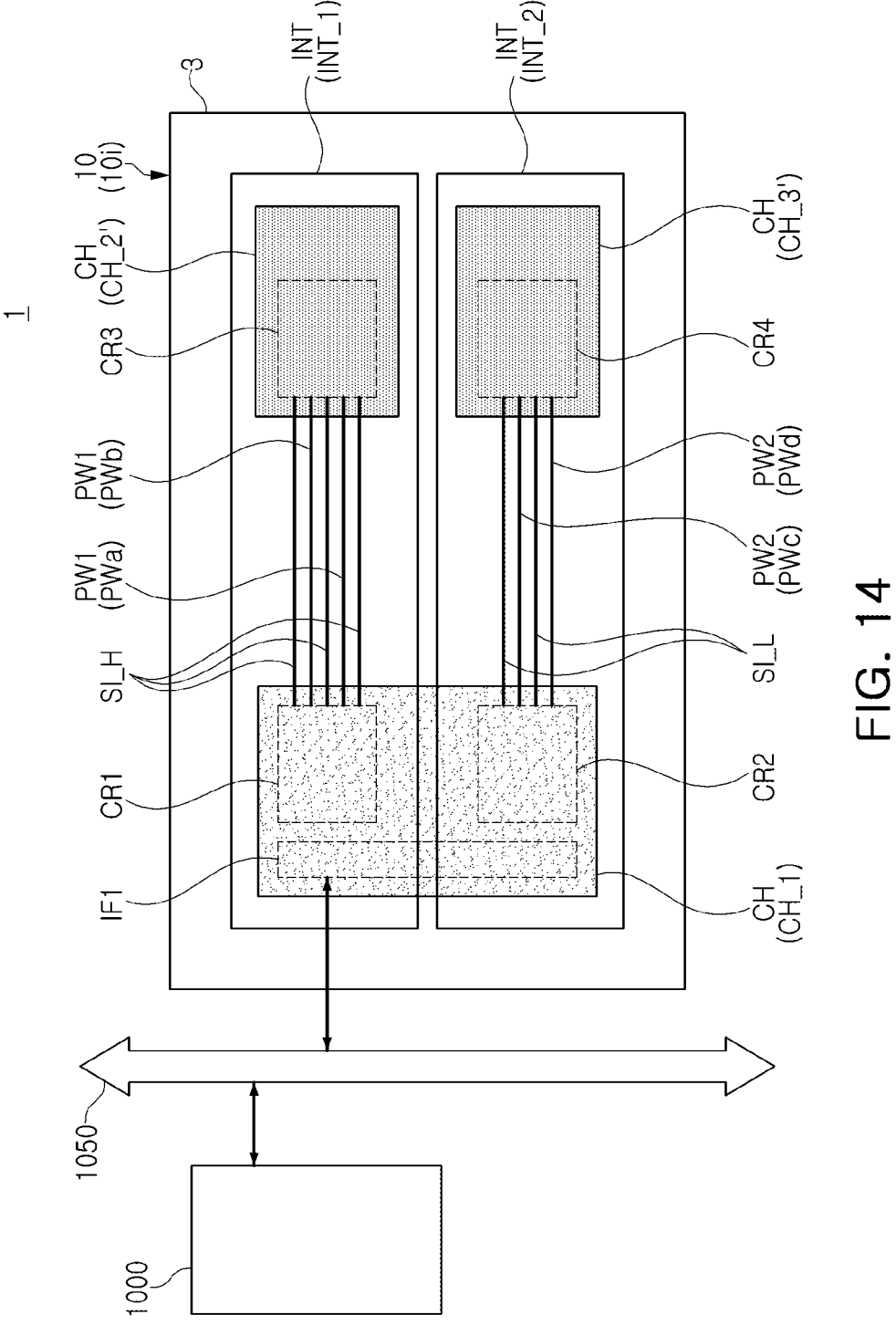
FIG. 14 is a diagram schematically illustrating a modified example of an electronic system including a semiconductor package according to some embodiments of the present inventive concept.

In the semiconductor package 10 of the electronic system described above with reference to FIGS. 1 to 13, the plurality of semiconductor chips CH may include the first semiconductor chip structure (CH_1 of FIG. 1) and the second semiconductor chip structure (CH_2 of FIG. 1) spaced apart from each other. However, the embodiments of the present inventive concept are not limited thereto. The second semiconductor chip structure (CH_2 of FIG. 1) described above may be replaced with a plurality of semiconductor chips respectively mounted on the plurality of interposers INT. An example in which the second semiconductor chip structure (CH_2 of FIG. 1) may be replaced with a plurality of semiconductor chip structures respectively mounted on the plurality of interposers INT will be described with reference to FIGS. 14, 15, and 16. FIG. 14 is a conceptual view illustrating an example in which the second semiconductor chip structure (CH_2 of FIG. 1) may be replaced with a plurality of semiconductor chip structures respectively mounted on the plurality of interposers INT described above in the electronic system 1 of FIG. 1, FIG. 15 is a top view schematically illustrating an example of a semiconductor package of the electronic system of FIG. 14, and FIG. 16 is a cross-sectional view schematically illustrating a region taken along lines IIId-IIId' and IV-IV' of FIG. 15.

Figure 15:
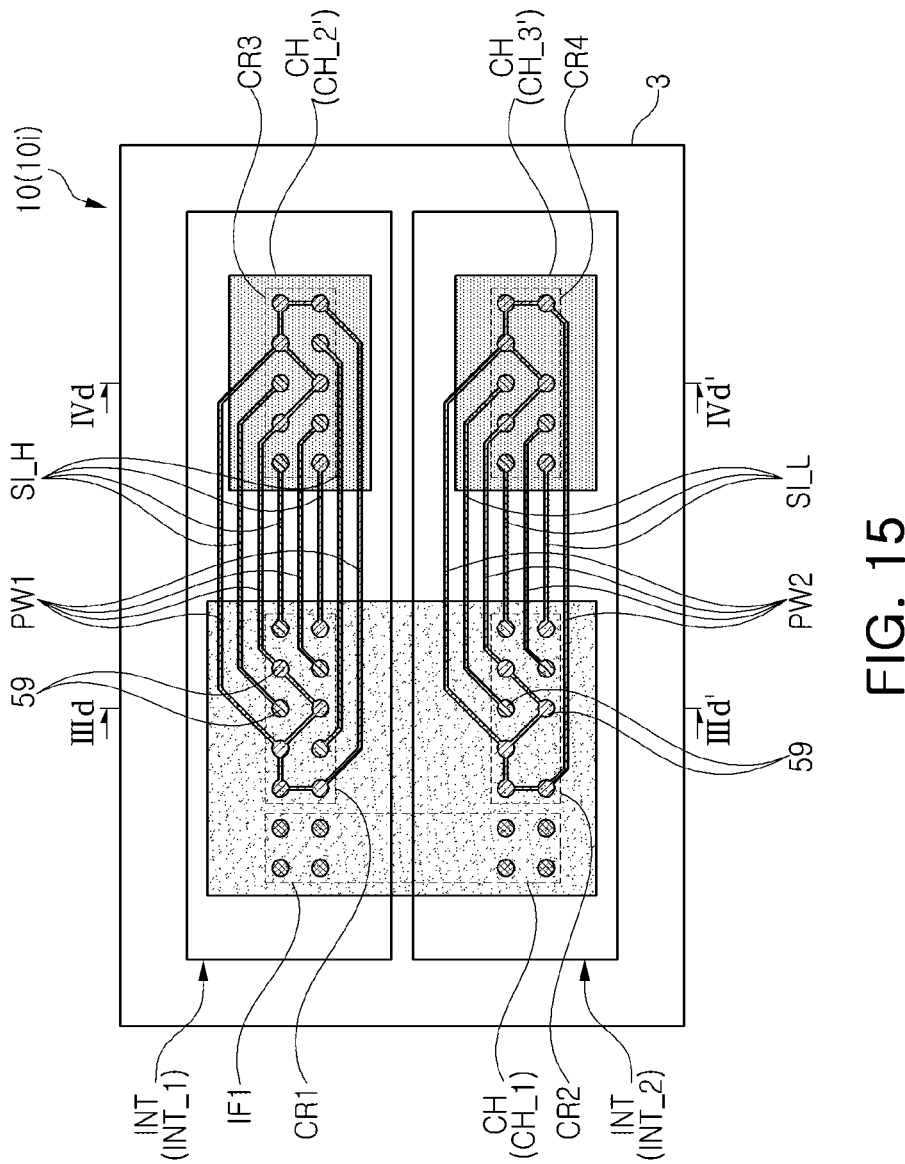
FIGS. 15 and 16 are diagrams schematically illustrating a semiconductor package according to some embodiments of the present inventive concept.
Figure 16:
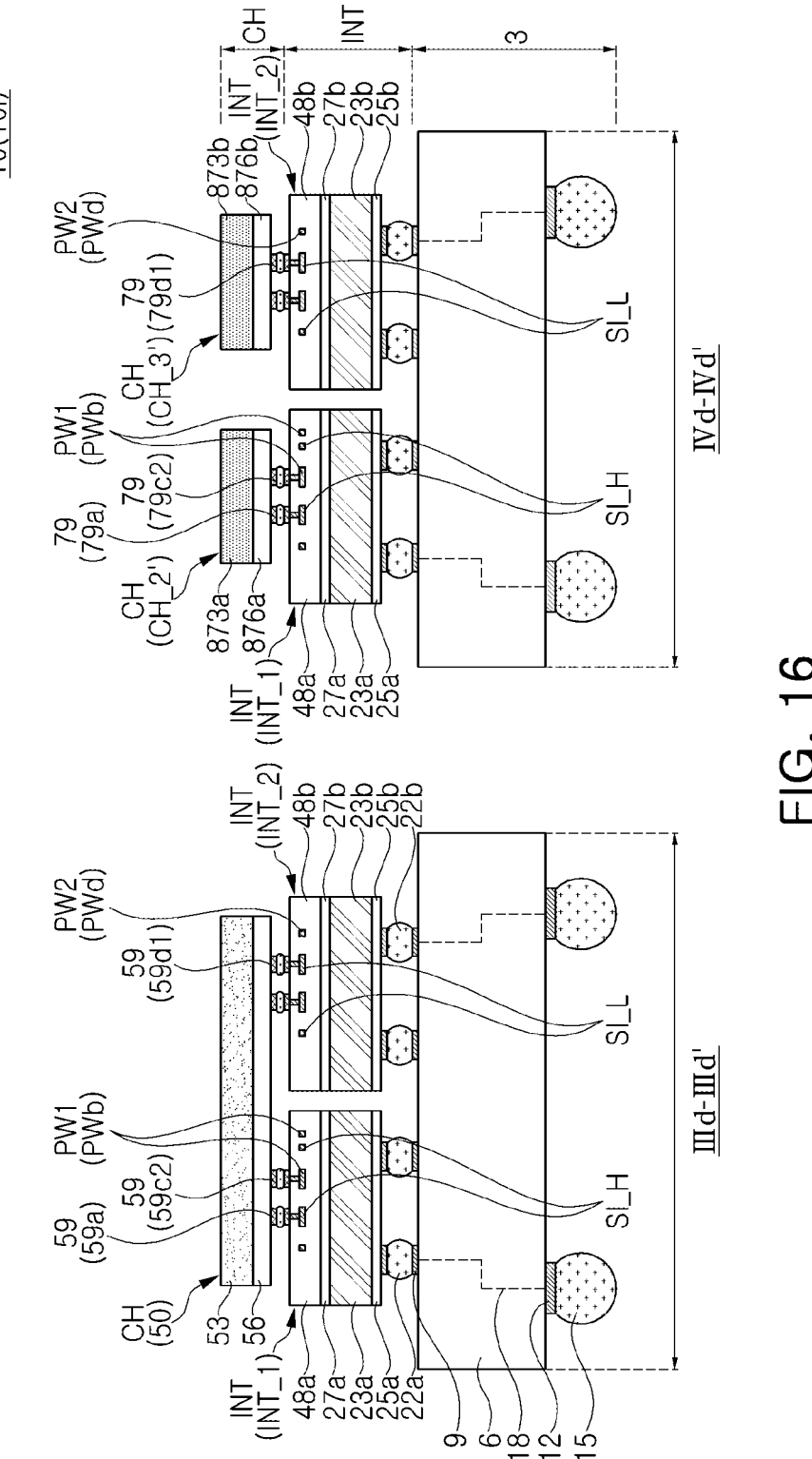

Referring to FIGS. 14, 15, and 16, the second semiconductor chip structure (CH_2 of FIG. 1) described above with reference to FIG. 1 may be replaced with a plurality of semiconductor chip structures CH_2' and CH_3' respectively mounted on the plurality of interposers INT.

The plurality of semiconductor chip structures CH_2' and CH_3' may be spaced apart from each other in a horizontal direction, and the semiconductor chip structure mounted on the first interposer INT_1 may be referred to as a second semiconductor chip structure CH_2', and the semiconductor chip structure mounted on the second interposer INT_2 may be referred to as a third semiconductor chip structure CH_3'.

The first and second interposers INT_1 and INT_2 may be silicon interposers as described with reference to FIGS. 3A to 3C, but the embodiment is not limited thereto. For example, the first and second interposers INT_1 and INT_2 may be redistribution interposers as shown in FIGS. 4A and 4B or redistribution interposers as shown in FIGS. 5A and 5B.

The first interposer INT_1 may include the first power/ground paths PW1 and the first signal paths SI_H as described above with reference to FIG. 1, and the second interposer INT_2 may include the second power/ground paths PW2 and the second signal paths SI_L as described above with reference to FIG. 1. The number of first signal paths SI_H may be greater than the number of second signal paths SI_L. For example, the number of first signal paths SI_H may be about 1.5 times to about 1.8 times greater than the number of second signal paths SI_L.

The circuit region CR3 of the second semiconductor chip structure CH_2' may communicate with the first circuit region CR1 of the first semiconductor chip structure CH_1 at a first rate through the first signal paths SI_H of the first interposer INT_1. The circuit region CR4 of the third semiconductor chip structure CH_3' may communicate with the second circuit region CR2 of the first semiconductor chip structure CH_1 at a second rate, slower than the first rate, through the second signal paths SI_L of the second interposer INT_2.

The second semiconductor chip structure CH_2' may include a semiconductor substrate 873a and a region 876a including the third circuit region CR3 below the semiconductor substrate 873a, and the third semiconductor chip structure CH_3' may include a semiconductor substrate 873b and a region 876b including the fourth circuit region CR4 below the semiconductor substrate 873b.

The second and third semiconductor chip structures CH_2' and CH_3' may be mounted on the first and second interposers INT_1 and INT_2 by a flip-chip bonding method as shown in FIG. 16, but the embodiments of the invention are not limited thereto. For example, at least one of the second and third semiconductor chip structures CH_2' and CH_3' may be mounted on the first and second interposers INT_1 and INT_2 in a wire bonding method similar to FIG. 7.

Each of the second and third semiconductor chip structures CH_2' and CH_3' may be a single chip, but embodiments of the present inventive concept are not limited thereto. For example, at least one of the second and third semiconductor chip structures CH_2' and CH_3' may be a stacked chip structure in which semiconductor chips are vertically stacked. For example, at least one of the second and third semiconductor chip structures CH_2' and CH_3' may be a stacked chip structure stacked by a wire bonding method as described above with reference to FIGS. 11 and 12, or may be a stacked chip structure interconnected by through-electrodes 773 as shown in FIG. 13.

According to embodiments, a semiconductor package including a first interposer providing first signal paths having a relatively high speed and a second interposer providing second signal paths having a relatively low speed, and an electronic system including the same may be provided.

A plurality of semiconductor chip structures mounted on the first and second interposers may communicate with each other at a first rate through the first signal paths of the first interposer and may communicate with each other at a second rate, slower than the first rate, through the second signal paths of the first interposer. In this manner, by providing the first signal paths and the second signal paths in the first and second interposers spaced apart from each other, the first signal paths and the second signal paths may be physically separated from each other.

As such, by separating the first interposer including the first signal paths and the second interposer including the second signal paths from each other, a noise coupling issue due to an increase in pattern arrangement density, that is, the occurrence of noise due to cross-talk may be reduced or prevented. For example, by physically separating the first signal paths and the second signal paths, the occurrence of noise coupling in a high-speed signal of the first signal paths may be reduced or prevented, thereby preventing deterioration of the characteristics of the high-speed signal. Accordingly, since noise that may occur between signal paths having different speeds may be reduced or prevented, the performance of the semiconductor package may be improved, and an electronic system including the semiconductor package with improved performance may be provided.

While example embodiments have been shown and described above, it will be apparent to those skilled in the art that modified examples and variations could be made without departing from the scope of the present inventive concept as defined by the appended claims.

What is claimed is:

1. An electronic system comprising:
a first interposer including first signal paths;
a second interposer spaced apart from the first interposer and including second signal paths;
a first semiconductor chip structure on the first and second interposers and including a first circuit region and a second circuit region; and
a second semiconductor chip structure on the first and second interposers and spaced apart from the first semiconductor chip structure,
wherein the second semiconductor chip structure includes:
a third circuit region configured to communicate with the first circuit region of the first semiconductor chip structure at a first rate through the first signal paths of the first interposer; and
a fourth circuit region configured to communicate with the second circuit region of the first semiconductor chip structure at a second rate, different from the first rate, through the second signal paths of the second interposer.

2. The electronic system of claim 1, further comprising:
a package substrate,
wherein the first and second interposers are on the package substrate.

3. The electronic system of claim 1, wherein
the first interposer further includes first power/ground paths adjacent the first signal paths, and
the second interposer further includes second power/ground paths adjacent the second signal paths.

4. The electronic system of claim 3, further comprising:
a third interposer spaced apart from the first and second interposers,
wherein the first and second semiconductor chip structures are on the first, second and third interposers.

5. The electronic system of claim 4, wherein the third interposer includes third power/ground paths, different from the first and second power/ground paths.

6. The electronic system of claim 5, wherein the third interposer does not include a signal path.

7. The electronic system of claim 1, wherein the first signal paths are at a same vertical level as the second signal paths.

8. The electronic system of claim 1, wherein at least one of the first and second semiconductor chip structures further includes an interface region, at least one of the first and second interposers further includes an interface path electrically connected to the interface region, and at least a portion of the interface path is at a same vertical level as the first and second signal paths.

9. The electronic system of claim 1, wherein each of the first and second interposers is a silicon interposer, wherein the first interposer further includes:

a first silicon substrate;

first through-electrode structures passing through the first silicon substrate; and a first interconnection structure electrically connected to the first through-electrode structures and on the first silicon substrate, wherein the second interposer further includes:

a second silicon substrate;

second through-electrode structures passing through the second silicon substrate; and a second interconnection structure electrically connected to the second through-electrode structures and on the second silicon substrate, wherein the first signal paths are at a same vertical level as at least a portion of the first interconnection structure, and the second signal paths are at a same vertical level as at least a portion of the second interconnection structure.

10. The electronic system of claim 1, wherein each of the first and second interposers is a redistribution interposer, wherein the redistribution interposer includes:

an insulating structure; and a redistribution structure having at least a portion in the insulating structure and on a different level, wherein at least a portion of the redistribution structure includes a line portion and a via portion extending from the line portion, and at least some of the redistribution structure is at a same vertical level as the first signal paths and the second signal paths.

11. The electronic system of claim 1, wherein at least one of the first and second semiconductor chip structures includes a plurality of semiconductor chips.

12. An electronic system comprising:

a first interposer including first signal paths;

a second interposer spaced apart from the first interposer and including second signal paths;

a controller semiconductor chip on the first and second interposers; and a memory semiconductor chip on the first and second interposers and spaced apart from the controller semiconductor chip, wherein the controller semiconductor chip is configured to communicate data with the memory semiconductor chip through the first signal paths of the first interposer, and the memory semiconductor chip is configured to receive a command and an address signal from the controller semiconductor chip through the second signal paths of the second interposer.

13. The electronic system of claim 12, wherein at least one of the first and second interposers further includes an interface path electrically connected to an interface region of the controller semiconductor chip, and the interface path is spaced apart from the first and second signal paths.

14. The electronic system of claim 12, further comprising:

a package substrate, wherein the first and second interposers are on the package substrate.

15. The electronic system of claim 12, further comprising:

a third interposer spaced apart from the first and second interposers, wherein the controller and memory semiconductor chips are on the first, second and third interposers, the first interposer further includes first power/ground paths adjacent the first signal paths, the second interposer further includes second power/ground paths adjacent the second signal paths, and the third interposer includes third power/ground paths, different from the first and second power/ground paths.

16. A semiconductor package comprising:

a package substrate;

a first interposer on the package substrate and including first signal paths;

a second interposer on the package substrate, spaced apart from the first interposer, and including second signal paths;

a first semiconductor chip structure on the first and second interposers; and at least one second semiconductor chip structure on the first and second interposers, electrically connected to the first semiconductor chip structure through the first signal paths, and electrically connected to the first semiconductor chip structure through the second signal paths, wherein a number of the first signal paths is different from a number of the second signal paths.

17. The semiconductor package of claim 16, wherein the number of the first signal paths is about 1.5 to about 1.8 times greater than the number of the second signal paths.

18. The semiconductor package of claim 16, wherein the second semiconductor chip structure is configured to communicate with the first semiconductor chip structure at a first rate through the first signal paths, and is configured to communicate with the first semiconductor chip structure at a second rate, slower than the first rate, through the second signal paths.

19. The semiconductor package of claim 16, wherein the second semiconductor chip structure includes a second semiconductor chip on the first interposer and a third semiconductor chip on the second interposer, and the second semiconductor chip and the third semiconductor chip are spaced apart from each other.

20. The semiconductor package of claim 16, further comprising:

a third interposer between the first and second interposers and spaced apart from the first and second interposers, wherein the first and second semiconductor chip structures are on the first, second, and third interposers, the first interposer further includes first power/ground paths adjacent the first signal paths;

the second interposer further includes second power/ground paths adjacent the second signal paths, and the third interposer does not include a signal path and includes third power/ground paths, different from the first and second power/ground paths.

\* \* \* \* \*